United States Patent
Akers et al.

(10) Patent No.: US 10,983,145 B2
(45) Date of Patent: Apr. 20, 2021

(54) SYSTEM FOR TESTING DEVICES INSIDE OF CARRIERS

(71) Applicant: Teradyne, Inc., North Reading, MA (US)

(72) Inventors: Larry W. Akers, Westford, MA (US); Philip Campbell, Bedford, NH (US); Valquirio Nazare Carvalho, Lowell, MA (US); Shant Orchanian, Winchester, MA (US)

(73) Assignee: TERADYNE, INC., North Reading, MA (US)

( * ) Notice: Subject to any disclaimer, the term of this patent is extended or adjusted under 35 U.S.C. 154(b) by 182 days.

(21) Appl. No.: 15/961,290

(22) Filed: Apr. 24, 2018

(65) Prior Publication Data
US 2019/0324056 A1    Oct. 24, 2019

(51) Int. Cl.
*G01R 1/04* (2006.01)
*G01R 31/28* (2006.01)

(52) U.S. Cl.
CPC ....... *G01R 1/0458* (2013.01); *G01R 31/2887* (2013.01); *G01R 31/2893* (2013.01)

(58) Field of Classification Search
CPC .............. G01R 1/0458; G01R 31/2887; G01R 31/2893; G01R 1/04; G01R 31/286; G01R 1/0408; G01R 1/0433; G01R 1/0441; G01R 1/0466; G01R 1/0483; G01R 31/2862; G01R 31/2863; G01R 31/2872; G01R 31/2874; G01R 31/2875; G01R 31/2877
See application file for complete search history.

(56) References Cited

U.S. PATENT DOCUMENTS

| 557,186 | A | 3/1896 | Cahill |
| 2,224,407 | A | 12/1940 | Passur |
| 2,380,026 | A | 7/1945 | Clarke |
| 2,631,775 | A | 3/1953 | Gordon |
| 2,635,524 | A | 4/1953 | Jenkins |
| 3,120,166 | A | 2/1964 | Lyman |

(Continued)

FOREIGN PATENT DOCUMENTS

| AU | 583716 B2 | 5/1989 |
| CN | 1114109 A | 12/1995 |

(Continued)

OTHER PUBLICATIONS

Heat sink, available at https://en.wikipedia.org/wiki/Heat_sink on Feb. 25, 2009 (Year: 2009).*

(Continued)

*Primary Examiner* — Daniel R Miller
(74) *Attorney, Agent, or Firm* — Burns & Levinson LLP

(57) ABSTRACT

An example test system includes a carrier having a test socket to receive a device to test. The test socket includes electrical connections. The test system also includes a lid assembly having a socket cap to contact the device to apply pressure to cause the device to connect electrically to the electrical connections. The socket cap includes a material having a thermal conductivity that exceeds a defined value. The lid assembly also includes one or more structures configured to provide surface area over which heat from the device dissipates. The one or more structures are made of a material having a thermal conductivity that exceeds the defined value.

22 Claims, 10 Drawing Sheets

(56) References Cited

U.S. PATENT DOCUMENTS

| | | |
|---|---|---|
| 3,360,032 A | 12/1967 | Sherwood |
| 3,364,838 A | 1/1968 | Bradley |
| 3,517,601 A | 6/1970 | Courchesne |
| 3,845,286 A | 10/1974 | Aronstein et al. |
| 3,917,375 A * | 11/1975 | Johnson ............... H05K 7/1038 439/487 |
| 4,147,299 A | 4/1979 | Freeman |
| 4,233,644 A | 11/1980 | Hwang et al. |
| 4,336,748 A | 6/1982 | Martin et al. |
| 4,379,259 A | 4/1983 | Varadi et al. |
| 4,477,127 A | 10/1984 | Kume |
| 4,495,545 A | 1/1985 | Dufresne et al. |
| 4,526,318 A | 7/1985 | Fleming et al. |
| 4,620,248 A | 10/1986 | Gitzendanner |
| 4,648,007 A | 3/1987 | Garner |
| 4,654,727 A | 3/1987 | Blum et al. |
| 4,654,732 A | 3/1987 | Mesher |
| 4,665,455 A | 5/1987 | Mesher |
| 4,683,424 A | 7/1987 | Cutright et al. |
| 4,685,303 A | 8/1987 | Branc et al. |
| 4,688,124 A | 8/1987 | Scribner et al. |
| 4,713,714 A | 12/1987 | Gatti et al. |
| 4,739,444 A | 4/1988 | Zushi et al. |
| 4,754,397 A | 6/1988 | Varaiya et al. |
| 4,768,285 A | 9/1988 | Woodman, Jr. |
| 4,775,281 A | 10/1988 | Prentakis |
| 4,778,063 A | 10/1988 | Ueberreiter |
| 4,801,234 A | 1/1989 | Cedrone |
| 4,809,881 A | 3/1989 | Becker |
| 4,817,273 A | 4/1989 | Lape et al. |
| 4,817,934 A | 4/1989 | McCormick et al. |
| 4,851,965 A | 7/1989 | Gabuzda et al. |
| 4,881,591 A | 11/1989 | Rignall |
| 4,888,549 A | 12/1989 | Wilson et al. |
| 4,911,281 A | 3/1990 | Jenkner |
| 4,967,155 A | 10/1990 | Magnuson |
| 5,012,187 A | 4/1991 | Littlebury |
| 5,045,960 A | 9/1991 | Eding |
| 5,061,630 A | 10/1991 | Knopf et al. |
| 5,094,584 A | 3/1992 | Bullock |
| 5,119,270 A | 6/1992 | Bolton et al. |
| 5,122,914 A | 6/1992 | Hanson |
| 5,127,684 A | 7/1992 | Klotz et al. |
| 5,128,813 A | 7/1992 | Lee |
| 5,136,395 A | 8/1992 | Ishii et al. |
| 5,143,193 A | 9/1992 | Geraci |
| 5,158,132 A | 10/1992 | Guillemot |
| 5,168,424 A | 12/1992 | Bolton et al. |
| 5,171,183 A | 12/1992 | Pollard et al. |
| 5,173,819 A | 12/1992 | Takahashi et al. |
| 5,176,202 A | 1/1993 | Richard |
| 5,205,132 A | 4/1993 | Fu |
| 5,206,772 A | 4/1993 | Hirano et al. |
| 5,207,613 A | 5/1993 | Ferchau et al. |
| 5,210,680 A | 5/1993 | Scheibler |
| 5,237,484 A | 8/1993 | Ferchau et al. |
| 5,263,537 A | 11/1993 | Plucinski et al. |
| 5,268,637 A | 12/1993 | Liken et al. |
| 5,269,698 A | 12/1993 | Singer |
| 5,295,392 A | 3/1994 | Hensel et al. |
| 5,309,323 A | 5/1994 | Gray et al. |
| 5,325,263 A | 6/1994 | Singer et al. |
| 5,343,403 A | 8/1994 | Beidle et al. |
| 5,349,486 A | 9/1994 | Sugimoto et al. |
| 5,368,072 A | 11/1994 | Cote |
| 5,374,395 A | 12/1994 | Robinson et al. |
| 5,379,229 A | 1/1995 | Parsons et al. |
| 5,398,058 A | 3/1995 | Hattori |
| 5,412,534 A | 5/1995 | Cutts et al. |
| 5,414,591 A | 5/1995 | Kimura et al. |
| 5,426,581 A | 6/1995 | Kishi et al. |
| 5,469,037 A | 11/1995 | McMurtrey, Sr. et al. |
| 5,477,416 A | 12/1995 | Schkrohowsky et al. |
| 5,484,012 A | 1/1996 | Hiratsuka |
| 5,486,681 A | 1/1996 | Dagnac et al. |
| 5,491,610 A | 2/1996 | Mok et al. |
| 5,543,727 A | 8/1996 | Bushard et al. |
| 5,546,250 A | 8/1996 | Diel |
| 5,557,186 A | 9/1996 | McMurtrey, Sr. et al. |
| 5,563,768 A | 10/1996 | Perdue |
| 5,570,740 A | 11/1996 | Flores et al. |
| 5,593,380 A | 1/1997 | Bittikofer |
| 5,601,141 A | 2/1997 | Gordon et al. |
| 5,604,662 A | 2/1997 | Anderson et al. |
| 5,610,893 A | 3/1997 | Soga et al. |
| 5,617,430 A | 4/1997 | Angelotti et al. |
| 5,644,705 A | 7/1997 | Stanley |
| 5,646,918 A | 7/1997 | Dimitri et al. |
| 5,654,846 A | 8/1997 | Wicks et al. |
| 5,673,029 A | 9/1997 | Behl et al. |
| 5,694,290 A | 12/1997 | Chang |
| 5,703,843 A | 12/1997 | Katsuyama et al. |
| 5,718,627 A | 2/1998 | Wicks |
| 5,718,628 A | 2/1998 | Nakazato et al. |
| 5,731,928 A | 3/1998 | Jabbari et al. |
| 5,751,549 A | 5/1998 | Eberhardt et al. |
| 5,754,365 A | 5/1998 | Beck et al. |
| 5,761,032 A | 6/1998 | Jones |
| 5,793,610 A | 8/1998 | Schmitt et al. |
| 5,811,678 A | 9/1998 | Hirano |
| 5,812,761 A | 9/1998 | Seki et al. |
| 5,813,817 A | 9/1998 | Matsumiya et al. |
| 5,819,842 A | 10/1998 | Potter et al. |
| 5,831,525 A | 11/1998 | Harvey |
| 5,851,143 A | 12/1998 | Hamid |
| 5,859,409 A | 1/1999 | Kim et al. |
| 5,859,540 A | 1/1999 | Fukumoto |
| 5,862,037 A | 1/1999 | Behl |
| 5,870,630 A | 2/1999 | Reasoner et al. |
| 5,886,639 A | 3/1999 | Behl et al. |
| 5,890,959 A | 4/1999 | Pettit et al. |
| 5,892,367 A | 4/1999 | Magee et al. |
| 5,912,799 A | 6/1999 | Grouell et al. |
| 5,913,926 A | 6/1999 | Anderson et al. |
| 5,914,856 A | 6/1999 | Morton et al. |
| 5,927,386 A | 7/1999 | Lin |
| 5,956,301 A | 9/1999 | Dimitri et al. |
| 5,959,834 A | 9/1999 | Chang |
| 5,999,356 A | 12/1999 | Dimitri et al. |
| 5,999,365 A | 12/1999 | Hasegawa et al. |
| 6,000,623 A | 12/1999 | Blatti et al. |
| 6,005,404 A | 12/1999 | Cochran et al. |
| 6,005,770 A | 12/1999 | Schmitt |
| 6,008,636 A | 12/1999 | Miller et al. |
| 6,008,984 A | 12/1999 | Cunningham et al. |
| 6,011,689 A | 1/2000 | Wrycraft |
| 6,031,717 A | 2/2000 | Baddour et al. |
| 6,034,870 A | 3/2000 | Osborn et al. |
| 6,042,348 A | 3/2000 | Aakalu et al. |
| 6,045,113 A | 4/2000 | Itakura |
| 6,055,814 A | 5/2000 | Song |
| 6,066,822 A | 5/2000 | Nemoto et al. |
| 6,067,225 A | 5/2000 | Reznikov et al. |
| 6,069,792 A | 5/2000 | Nelik |
| 6,072,322 A | 6/2000 | Viswanath et al. |
| 6,084,768 A | 7/2000 | Bologna |
| 6,094,342 A | 7/2000 | Dague et al. |
| 6,104,607 A | 8/2000 | Behl |
| 6,107,813 A | 8/2000 | Sinsheimer et al. |
| 6,115,250 A | 9/2000 | Schmitt |
| 6,122,131 A | 9/2000 | Jeppson |
| 6,122,232 A | 9/2000 | Schell et al. |
| 6,124,707 A | 9/2000 | Kim et al. |
| 6,129,428 A | 10/2000 | Helwig et al. |
| 6,130,817 A | 10/2000 | Flotho et al. |
| 6,144,553 A | 11/2000 | Hileman et al. |
| 6,166,901 A | 12/2000 | Gamble et al. |
| 6,169,413 B1 | 1/2001 | Paek et al. |
| 6,169,930 B1 | 1/2001 | Blachek et al. |
| 6,177,805 B1 | 1/2001 | Pih |
| 6,178,835 B1 | 1/2001 | Orriss et al. |
| 6,181,557 B1 | 1/2001 | Gatti |
| 6,185,065 B1 | 2/2001 | Hasegawa et al. |
| 6,185,097 B1 | 2/2001 | Behl |

(56) References Cited

U.S. PATENT DOCUMENTS

| | | |
|---|---|---|
| 6,188,191 B1 | 2/2001 | Frees et al. |
| 6,192,282 B1 | 2/2001 | Smith et al. |
| 6,193,339 B1 | 2/2001 | Behl et al. |
| 6,209,842 B1 | 4/2001 | Anderson et al. |
| 6,227,516 B1 | 5/2001 | Webster, Jr. et al. |
| 6,229,275 B1 | 5/2001 | Yamamoto |
| 6,231,145 B1 | 5/2001 | Liu |
| 6,233,148 B1 | 5/2001 | Shen |
| 6,236,563 B1 | 5/2001 | Buican et al. |
| 6,247,944 B1 | 6/2001 | Bolognia et al. |
| 6,249,824 B1 | 6/2001 | Henrichs |
| 6,252,769 B1 | 6/2001 | Tullstedt et al. |
| 6,262,863 B1 | 7/2001 | Ostwald et al. |
| 6,272,007 B1 | 8/2001 | Kitlas et al. |
| 6,272,767 B1 | 8/2001 | Botruff et al. |
| 6,281,677 B1 | 8/2001 | Cosci et al. |
| 6,282,501 B1 | 8/2001 | Assouad |
| 6,285,524 B1 | 9/2001 | Boigenzahn et al. |
| 6,289,678 B1 | 9/2001 | Pandolfi |
| 6,297,950 B1 | 10/2001 | Erwin |
| 6,298,672 B1 | 10/2001 | Valicoff, Jr. |
| 6,302,714 B1 | 10/2001 | Bolognia et al. |
| 6,304,839 B1 | 10/2001 | Ho et al. |
| 6,307,386 B1 | 10/2001 | Fowler et al. |
| 6,327,150 B1 | 12/2001 | Levy et al. |
| 6,330,154 B1 | 12/2001 | Fryers et al. |
| 6,351,379 B1 | 2/2002 | Cheng |
| 6,354,792 B1 | 3/2002 | Kobayashi et al. |
| 6,356,409 B1 | 3/2002 | Price et al. |
| 6,356,415 B1 | 3/2002 | Kabasawa |
| 6,384,995 B1 | 5/2002 | Smith |
| 6,388,437 B1 | 5/2002 | Wolski et al. |
| 6,388,875 B1 | 5/2002 | Chen |
| 6,388,878 B1 | 5/2002 | Chang |
| 6,389,225 B1 | 5/2002 | Malinoski et al. |
| 6,390,756 B1 | 5/2002 | Isaacs et al. |
| 6,411,584 B2 | 6/2002 | Davis et al. |
| 6,421,236 B1 | 7/2002 | Montoya et al. |
| 6,434,000 B1 | 8/2002 | Pandolfi |
| 6,434,498 B1 | 8/2002 | Ulrich et al. |
| 6,434,499 B1 | 8/2002 | Ulrich et al. |
| 6,464,080 B1 | 10/2002 | Morris et al. |
| 6,467,153 B2 | 10/2002 | Butts et al. |
| 6,473,297 B1 | 10/2002 | Behl et al. |
| 6,473,301 B1 | 10/2002 | Levy et al. |
| 6,476,627 B1 | 11/2002 | Pelissier et al. |
| 6,477,044 B2 | 11/2002 | Foley et al. |
| 6,477,442 B1 | 11/2002 | Valerino, Sr. |
| 6,480,380 B1 | 11/2002 | French et al. |
| 6,480,382 B2 | 11/2002 | Cheng |
| 6,487,071 B1 | 11/2002 | Tata et al. |
| 6,489,793 B2 | 12/2002 | Jones et al. |
| 6,494,663 B2 | 12/2002 | Ostwald et al. |
| 6,525,933 B2 | 2/2003 | Eland |
| 6,526,841 B1 | 3/2003 | Wanek et al. |
| 6,535,384 B2 | 3/2003 | Huang |
| 6,537,013 B2 | 3/2003 | Emberty et al. |
| 6,544,309 B1 | 4/2003 | Hoefer et al. |
| 6,546,445 B1 | 4/2003 | Hayes |
| 6,553,532 B1 | 4/2003 | Aoki |
| 6,560,107 B1 | 5/2003 | Beck et al. |
| 6,565,163 B2 | 5/2003 | Behl et al. |
| 6,566,859 B2 | 5/2003 | Wolski et al. |
| 6,567,266 B2 | 5/2003 | Ives et al. |
| 6,568,770 B2 | 5/2003 | Gonska et al. |
| 6,570,734 B2 | 5/2003 | Ostwald et al. |
| 6,577,586 B1 | 6/2003 | Yang et al. |
| 6,577,687 B2 | 6/2003 | Hall et al. |
| 6,618,254 B2 | 9/2003 | Ives |
| 6,626,846 B2 | 9/2003 | Spencer |
| 6,628,518 B2 | 9/2003 | Behl et al. |
| 6,635,115 B1 | 10/2003 | Fairbairn et al. |
| 6,640,235 B1 | 10/2003 | Anderson |
| 6,644,982 B2 | 11/2003 | Ondricek et al. |
| 6,651,192 B1 | 11/2003 | Viglione et al. |
| 6,654,240 B1 | 11/2003 | Tseng et al. |
| 6,679,128 B2 | 1/2004 | Wanek et al. |
| 6,693,757 B2 | 2/2004 | Hayakawa et al. |
| 6,736,583 B2 | 5/2004 | Ostwald et al. |
| 6,741,529 B1 | 5/2004 | Getreuer |
| 6,746,648 B1 | 6/2004 | Mattila et al. |
| 6,751,093 B1 | 6/2004 | Hsu et al. |
| 6,791,785 B1 | 9/2004 | Messenger et al. |
| 6,791,799 B2 | 9/2004 | Fletcher |
| 6,798,651 B2 | 9/2004 | Syring et al. |
| 6,798,972 B1 | 9/2004 | Ito et al. |
| 6,801,834 B1 | 10/2004 | Konshak et al. |
| 6,806,700 B2 | 10/2004 | Wanek et al. |
| 6,808,353 B2 | 10/2004 | Ostwald et al. |
| 6,811,427 B2 | 11/2004 | Garrett et al. |
| 6,826,046 B1 | 11/2004 | Muncaster et al. |
| 6,830,372 B2 | 12/2004 | Liu et al. |
| 6,832,929 B2 | 12/2004 | Garrett et al. |
| 6,861,861 B2 | 3/2005 | Song et al. |
| 6,862,173 B1 | 3/2005 | Konshak et al. |
| 6,867,939 B2 | 3/2005 | Katahara et al. |
| 6,892,328 B2 | 5/2005 | Klein et al. |
| 6,904,479 B2 | 6/2005 | Hall et al. |
| 6,908,330 B2 | 6/2005 | Garrett et al. |
| 6,928,336 B2 | 8/2005 | Peshkin et al. |
| 6,937,432 B2 | 8/2005 | Sri-Jayantha et al. |
| 6,957,291 B2 | 10/2005 | Moon et al. |
| 6,965,811 B2 | 11/2005 | Dickey et al. |
| 6,974,017 B2 | 12/2005 | Oseguera |
| 6,976,190 B1 | 12/2005 | Goldstone |
| 6,980,381 B2 | 12/2005 | Gray et al. |
| 6,982,872 B2 | 1/2006 | Behl et al. |
| 7,006,325 B2 | 2/2006 | Emberty et al. |
| 7,013,198 B2 | 3/2006 | Haas |
| 7,021,883 B1 | 4/2006 | Plutt et al. |
| 7,039,924 B2 | 5/2006 | Goodman et al. |
| 7,054,150 B2 | 5/2006 | Orriss et al. |
| 7,070,323 B2 | 7/2006 | Wanek et al. |
| 7,076,391 B1 | 7/2006 | Pakzad et al. |
| 7,077,614 B1 | 7/2006 | Hasper et al. |
| 7,088,541 B2 | 8/2006 | Orriss et al. |
| 7,092,251 B1 | 8/2006 | Henry |
| 7,106,582 B2 | 9/2006 | Albrecht et al. |
| 7,123,477 B2 | 10/2006 | Coglitore et al. |
| 7,126,777 B2 | 10/2006 | Flechsig et al. |
| 7,130,138 B2 | 10/2006 | Lum et al. |
| 7,134,553 B2 | 11/2006 | Stephens |
| 7,139,145 B1 | 11/2006 | Archibald et al. |
| 7,164,579 B2 | 1/2007 | Muncaster et al. |
| 7,167,360 B2 | 1/2007 | Inoue et al. |
| 7,181,458 B1 | 2/2007 | Higashi |
| 7,203,021 B1 | 4/2007 | Ryan et al. |
| 7,203,060 B2 | 4/2007 | Kay et al. |
| 7,206,201 B2 | 4/2007 | Behl et al. |
| 7,216,968 B2 | 5/2007 | Smith et al. |
| 7,219,028 B2 | 5/2007 | Bae et al. |
| 7,219,273 B2 | 5/2007 | Fisher et al. |
| 7,227,746 B2 | 6/2007 | Tanaka et al. |
| 7,232,101 B2 | 6/2007 | Wanek et al. |
| 7,243,043 B2 | 7/2007 | Shin |
| 7,248,467 B2 | 7/2007 | Sri-Jayantha et al. |
| 7,259,966 B2 | 8/2007 | Connelly, Jr. et al. |
| 7,273,344 B2 | 9/2007 | Ostwald et al. |
| 7,280,353 B2 | 10/2007 | Wendel et al. |
| 7,289,885 B2 | 10/2007 | Basham et al. |
| 7,304,855 B1 | 12/2007 | Milligan et al. |
| 7,315,447 B2 | 1/2008 | Inoue et al. |
| 7,349,205 B2 | 3/2008 | Hall et al. |
| 7,353,524 B1 | 4/2008 | Lin et al. |
| 7,385,385 B2 | 6/2008 | Magliocco et al. |
| 7,395,133 B2 | 7/2008 | Lowe |
| 7,403,451 B2 | 7/2008 | Goodman et al. |
| 7,421,623 B2 | 9/2008 | Haugh |
| 7,437,212 B2 | 10/2008 | Farchmin et al. |
| 7,447,011 B2 | 11/2008 | Wade et al. |
| 7,457,112 B2 | 11/2008 | Fukuda et al. |
| 7,467,024 B2 | 12/2008 | Flitsch |
| 7,476,362 B2 | 1/2009 | Angros |
| 7,483,269 B1 | 1/2009 | Marvin, Jr. et al. |

(56) References Cited

U.S. PATENT DOCUMENTS

| | | |
|---|---|---|
| 7,505,264 B2 | 3/2009 | Hall et al. |
| 7,554,811 B2 | 6/2009 | Scicluna et al. |
| 7,568,122 B2 | 7/2009 | Mechalke et al. |
| 7,570,455 B2 | 8/2009 | Deguchi et al. |
| 7,573,715 B2 | 8/2009 | Mojaver et al. |
| 7,584,851 B2 | 9/2009 | Hong et al. |
| 7,612,996 B2 | 11/2009 | Atkins et al. |
| 7,625,027 B2 | 12/2009 | Kiaie et al. |
| 7,630,196 B2 | 12/2009 | Hall et al. |
| 7,635,246 B2 | 12/2009 | Neeper et al. |
| 7,643,289 B2 | 1/2010 | Ye et al. |
| 7,646,596 B2 | 1/2010 | Ng |
| 7,729,107 B2 | 6/2010 | Atkins et al. |
| 7,778,031 B1 | 8/2010 | Merrow et al. |
| 7,789,267 B2 | 9/2010 | Hutchinson et al. |
| 7,848,106 B2 | 12/2010 | Merrow |
| 7,890,207 B2 | 2/2011 | Toscano et al. |
| 7,904,211 B2 | 3/2011 | Merrow et al. |
| 7,908,029 B2 | 3/2011 | Slocum, III |
| 7,911,778 B2 | 3/2011 | Merrow |
| 7,920,380 B2 | 4/2011 | Merrow et al. |
| 7,929,303 B1 | 4/2011 | Merrow |
| 7,932,734 B2 | 4/2011 | Merrow et al. |
| 7,940,529 B2 | 5/2011 | Merrow et al. |
| 7,945,424 B2 | 5/2011 | Garcia et al. |
| 7,987,018 B2 | 7/2011 | Polyakov et al. |
| 7,995,349 B2 | 8/2011 | Merrow et al. |
| 7,996,174 B2 | 8/2011 | Garcia et al. |
| 8,041,449 B2 | 10/2011 | Noble et al. |
| 8,086,343 B2 | 12/2011 | Slocum, III |
| 8,095,234 B2 | 1/2012 | Polyakov et al. |
| 8,102,173 B2 | 1/2012 | Merrow |
| 8,116,079 B2 | 2/2012 | Merrow |
| 8,117,480 B2 | 2/2012 | Merrow et al. |
| 8,140,182 B2 | 3/2012 | Noble et al. |
| 8,160,739 B2 | 4/2012 | Toscano et al. |
| 8,238,099 B2 | 8/2012 | Merrow |
| 8,279,603 B2 | 10/2012 | Merrow et al. |
| 8,305,751 B2 | 11/2012 | Merrow |
| 8,405,971 B2 | 3/2013 | Merrow et al. |
| 8,466,699 B2 | 6/2013 | Merrow et al. |
| 8,467,180 B2 | 6/2013 | Merrow et al. |
| 8,482,915 B2 | 7/2013 | Merrow |
| 8,499,611 B2 | 8/2013 | Merrow et al. |
| 8,547,123 B2 | 10/2013 | Merrow et al. |
| 8,549,912 B2 | 10/2013 | Merrow et al. |
| 8,628,239 B2 | 1/2014 | Merrow et al. |
| 8,631,698 B2 | 1/2014 | Merrow et al. |
| 8,655,482 B2 | 2/2014 | Merrow |
| 8,687,349 B2 | 4/2014 | Truebenbach |
| 8,687,356 B2 | 4/2014 | Merrow |
| 9,001,456 B2 | 4/2015 | Campbell et al. |
| 9,002,186 B2 | 4/2015 | Akers et al. |
| 9,880,199 B2 | 1/2018 | Carvalho |
| 2001/0006453 A1 | 7/2001 | Glorioso et al. |
| 2001/0044023 A1 | 11/2001 | Johnson et al. |
| 2001/0046118 A1 | 11/2001 | Yamanashi et al. |
| 2001/0048590 A1 | 12/2001 | Behl et al. |
| 2002/0030981 A1 | 3/2002 | Sullivan et al. |
| 2002/0044416 A1 | 4/2002 | Harmon et al. |
| 2002/0051338 A1 | 5/2002 | Jiang et al. |
| 2002/0071248 A1 | 6/2002 | Huang et al. |
| 2002/0079422 A1 | 6/2002 | Jiang |
| 2002/0090320 A1 | 7/2002 | Burow et al. |
| 2002/0116087 A1 | 8/2002 | Brown |
| 2002/0161971 A1 | 10/2002 | Dimitri et al. |
| 2002/0172004 A1 | 11/2002 | Ives et al. |
| 2003/0035271 A1 | 2/2003 | Lelong et al. |
| 2003/0043550 A1 | 3/2003 | Ives |
| 2003/0206397 A1 | 11/2003 | Allgeyer et al. |
| 2004/0165489 A1 | 8/2004 | Goodman et al. |
| 2004/0230399 A1 | 11/2004 | Shin |
| 2004/0236465 A1 | 11/2004 | Butka et al. |
| 2004/0264121 A1 | 12/2004 | Orriss et al. |
| 2005/0004703 A1 | 1/2005 | Christie |
| 2005/0010836 A1 | 1/2005 | Bae et al. |
| 2005/0018397 A1 | 1/2005 | Kay et al. |
| 2005/0055601 A1 | 3/2005 | Wilson et al. |
| 2005/0057849 A1 | 3/2005 | Twogood et al. |
| 2005/0069400 A1 | 3/2005 | Dickey et al. |
| 2005/0109131 A1 | 5/2005 | Wanek et al. |
| 2005/0116702 A1 | 6/2005 | Wanek et al. |
| 2005/0131578 A1 | 6/2005 | Weaver |
| 2005/0179457 A1 | 8/2005 | Min et al. |
| 2005/0207059 A1 | 9/2005 | Cochrane |
| 2005/0219809 A1 | 10/2005 | Muncaster et al. |
| 2005/0225338 A1 | 10/2005 | Sands et al. |
| 2005/0270737 A1 | 12/2005 | Wilson et al. |
| 2006/0010353 A1 | 1/2006 | Haugh |
| 2006/0023331 A1 | 2/2006 | Flechsig et al. |
| 2006/0028802 A1 | 2/2006 | Shaw et al. |
| 2006/0066974 A1 | 3/2006 | Akamatsu et al. |
| 2006/0130316 A1 | 6/2006 | Takase et al. |
| 2006/0190205 A1 | 8/2006 | Klein et al. |
| 2006/0227517 A1 | 10/2006 | Zayas et al. |
| 2006/0250766 A1 | 11/2006 | Blaalid et al. |
| 2007/0034368 A1 | 2/2007 | Atkins et al. |
| 2007/0035874 A1 | 2/2007 | Wendel et al. |
| 2007/0035875 A1 | 2/2007 | Hall et al. |
| 2007/0053154 A1 | 3/2007 | Fukuda et al. |
| 2007/0082907 A1 | 4/2007 | Canada et al. |
| 2007/0127202 A1 | 6/2007 | Scicluna et al. |
| 2007/0127206 A1 | 6/2007 | Wade et al. |
| 2007/0183871 A1 | 8/2007 | Hofmeister et al. |
| 2007/0195497 A1 | 8/2007 | Atkins |
| 2007/0248142 A1 | 10/2007 | Rountree et al. |
| 2007/0253157 A1 | 11/2007 | Atkins et al. |
| 2007/0286045 A1 | 12/2007 | Onagi et al. |
| 2008/0007865 A1 | 1/2008 | Orriss et al. |
| 2008/0030945 A1 | 2/2008 | Mojaver et al. |
| 2008/0112075 A1 | 5/2008 | Farquhar et al. |
| 2008/0239564 A1 | 10/2008 | Farquhar et al. |
| 2008/0282275 A1 | 11/2008 | Zaczek et al. |
| 2008/0282278 A1 | 11/2008 | Barkley |
| 2009/0028669 A1 | 1/2009 | Rebstock |
| 2009/0082907 A1 | 3/2009 | Stuvel et al. |
| 2009/0122443 A1 | 5/2009 | Farquhar et al. |
| 2009/0142169 A1 | 6/2009 | Garcia et al. |
| 2009/0153992 A1 | 6/2009 | Garcia et al. |
| 2009/0153993 A1 | 6/2009 | Garcia et al. |
| 2009/0153994 A1 | 6/2009 | Merrow et al. |
| 2009/0175705 A1 | 7/2009 | Nakao et al. |
| 2009/0261047 A1 | 10/2009 | Merrow |
| 2009/0261228 A1* | 10/2009 | Merrow ............ G05D 23/1928 248/550 |
| 2009/0261229 A1 | 10/2009 | Merrow |
| 2009/0262444 A1 | 10/2009 | Polyakov et al. |
| 2009/0262445 A1 | 10/2009 | Noble et al. |
| 2009/0262454 A1 | 10/2009 | Merrow |
| 2009/0262455 A1 | 10/2009 | Merrow |
| 2009/0265032 A1 | 10/2009 | Toscano et al. |
| 2009/0265043 A1 | 10/2009 | Merrow et al. |
| 2009/0265136 A1 | 10/2009 | Garcia et al. |
| 2009/0297328 A1 | 12/2009 | Slocum, III |
| 2010/0074404 A1 | 3/2010 | Ito |
| 2010/0083732 A1 | 4/2010 | Merrow et al. |
| 2010/0165498 A1 | 7/2010 | Merrow et al. |
| 2010/0165501 A1 | 7/2010 | Polyakov et al. |
| 2010/0168906 A1 | 7/2010 | Toscano et al. |
| 2010/0172722 A1 | 7/2010 | Noble et al. |
| 2010/0193661 A1 | 8/2010 | Merrow |
| 2010/0194253 A1 | 8/2010 | Merrow et al. |
| 2010/0195236 A1 | 8/2010 | Merrow et al. |
| 2010/0249993 A1 | 9/2010 | Mitsuyoshi |
| 2010/0265609 A1 | 10/2010 | Merrow et al. |
| 2010/0265610 A1 | 10/2010 | Merrow et al. |
| 2010/0302678 A1 | 12/2010 | Merrow |
| 2011/0011844 A1 | 1/2011 | Merrow et al. |
| 2011/0012631 A1 | 1/2011 | Merrow et al. |
| 2011/0012632 A1 | 1/2011 | Merrow et al. |
| 2011/0013362 A1 | 1/2011 | Merrow et al. |
| 2011/0013665 A1 | 1/2011 | Merrow et al. |
| 2011/0013666 A1 | 1/2011 | Merrow et al. |
| 2011/0013667 A1 | 1/2011 | Merrow et al. |

(56) References Cited

U.S. PATENT DOCUMENTS

| | | |
|---|---|---|
| 2011/0064546 A1 | 3/2011 | Merrow |
| 2011/0157825 A1 | 6/2011 | Merrow et al. |
| 2011/0172807 A1 | 7/2011 | Merrow |
| 2011/0185811 A1 | 8/2011 | Merrow et al. |
| 2011/0189934 A1 | 8/2011 | Merrow |
| 2011/0236163 A1 | 9/2011 | Smith et al. |
| 2011/0261483 A1 | 10/2011 | Campbell et al. |
| 2011/0305132 A1 | 12/2011 | Merrow et al. |
| 2011/0310724 A1 | 12/2011 | Martino |
| 2012/0023370 A1 | 1/2012 | Truebenbach |
| 2012/0034054 A1 | 2/2012 | Polyakov et al. |
| 2012/0050903 A1 | 3/2012 | Campbell et al. |
| 2012/0106351 A1 | 5/2012 | Gohel et al. |
| 2012/0321435 A1 | 12/2012 | Truebenbach |
| 2013/0071224 A1 | 3/2013 | Merrow et al. |
| 2013/0108253 A1 | 5/2013 | Akers et al. |
| 2013/0256967 A1 | 10/2013 | Carvalho |
| 2014/0253157 A1 | 9/2014 | Dean et al. |
| 2014/0271064 A1 | 9/2014 | Merrow et al. |
| 2014/0306728 A1 | 10/2014 | Arena et al. |
| 2015/0289413 A1 | 10/2015 | Rush et al. |
| 2017/0059635 A1 | 3/2017 | Orchanian et al. |
| 2018/0252762 A1* | 9/2018 | Jovanovic ............ H05K 7/1402 |
| 2019/0064252 A1 | 2/2019 | Bowyer et al. |
| 2019/0064254 A1 | 2/2019 | Bowyer et al. |
| 2019/0064261 A1 | 2/2019 | Bowyer et al. |
| 2019/0064305 A1 | 2/2019 | Khalid |
| 2020/0057093 A1 | 2/2020 | Carvalho et al. |

FOREIGN PATENT DOCUMENTS

| | | |
|---|---|---|
| CN | 1177187 A | 3/1998 |
| CN | 1192544 A | 9/1998 |
| CN | 2341188 Y | 9/1999 |
| DE | 3786944 T2 | 11/1993 |
| DE | 69111634 T2 | 5/1996 |
| DE | 69400145 T2 | 10/1996 |
| DE | 19701548 A1 | 8/1997 |
| DE | 19804813 A1 | 9/1998 |
| DE | 69614460 T2 | 6/2002 |
| DE | 69626584 T2 | 12/2003 |
| DE | 19861388 B4 | 8/2007 |
| EP | 0210497 A2 | 2/1987 |
| EP | 0242970 A2 | 10/1987 |
| EP | 0 277 634 A2 | 8/1988 |
| EP | 0356977 A2 | 3/1990 |
| EP | 0442642 A2 | 8/1991 |
| EP | 0466073 A2 | 1/1992 |
| EP | 582017 A1 | 2/1994 |
| EP | 0617570 A1 | 9/1994 |
| EP | 0635836 A1 | 1/1995 |
| EP | 741508 A2 | 11/1996 |
| EP | 0757320 A2 | 2/1997 |
| EP | 0757351 A2 | 2/1997 |
| EP | 0776009 A2 | 5/1997 |
| EP | 0840476 A2 | 5/1998 |
| EP | 1 045 301 A2 | 10/2000 |
| EP | 1209557 A2 | 5/2002 |
| EP | 1234308 A1 | 8/2002 |
| EP | 1422713 A2 | 5/2004 |
| EP | 1612798 A1 | 1/2006 |
| EP | 1760722 A1 | 3/2007 |
| GB | 2241118 A | 8/1991 |
| GB | 2276275 A | 9/1994 |
| GB | 2299436 A | 10/1996 |
| GB | 2312984 A | 11/1997 |
| GB | 2328782 A | 3/1999 |
| GB | 2439844 A | 1/2008 |
| JP | 61-115279 | 6/1986 |
| JP | 62-177621 | 8/1987 |
| JP | 62-239394 | 10/1987 |
| JP | 62-251915 | 11/1987 |
| JP | 63-002160 | 1/1988 |
| JP | 63-016482 | 1/1988 |
| JP | 63-062057 | 3/1988 |
| JP | 63-201946 | 8/1988 |
| JP | 63-004483 | 9/1988 |
| JP | 63-214972 | 9/1988 |
| JP | 63-269376 | 11/1988 |
| JP | S63-195697 U | 12/1988 |
| JP | 64-089034 | 4/1989 |
| JP | 2-091565 | 3/1990 |
| JP | 2-098197 | 4/1990 |
| JP | 2-185784 | 7/1990 |
| JP | 2-199690 | 8/1990 |
| JP | 2-278375 | 11/1990 |
| JP | 2-297770 | 12/1990 |
| JP | 3-078160 B2 | 4/1991 |
| JP | 3-105704 B2 | 5/1991 |
| JP | H05-319520 A | 12/1993 |
| JP | 6-004220 | 1/1994 |
| JP | 6-004981 | 1/1994 |
| JP | 6-162645 | 6/1994 |
| JP | 6-181561 | 6/1994 |
| JP | 6-215515 | 8/1994 |
| JP | 6-274943 | 9/1994 |
| JP | 6-314173 | 11/1994 |
| JP | 7-007321 | 1/1995 |
| JP | 7-029364 | 1/1995 |
| JP | H07-010212 A | 1/1995 |
| JP | 7-037376 | 2/1995 |
| JP | 7-056654 | 3/1995 |
| JP | 7-111078 | 4/1995 |
| JP | 7-115497 | 5/1995 |
| JP | 7-201082 | 8/1995 |
| JP | 7-226023 | 8/1995 |
| JP | 7-230669 | 8/1995 |
| JP | 7-257525 | 10/1995 |
| JP | 1982246 | 10/1995 |
| JP | 7-307059 | 11/1995 |
| JP | 8007994 | 1/1996 |
| JP | 8-030398 | 2/1996 |
| JP | 8-030407 | 2/1996 |
| JP | 8-079672 | 3/1996 |
| JP | 8-106776 | 4/1996 |
| JP | 8-110821 | 4/1996 |
| JP | 8-167231 | 6/1996 |
| JP | 8-212015 | 8/1996 |
| JP | 8-244313 | 9/1996 |
| JP | 8-263525 | 10/1996 |
| JP | 8-263909 | 10/1996 |
| JP | 8-297957 | 11/1996 |
| JP | 2553315 B2 | 11/1996 |
| JP | 9-044445 | 2/1997 |
| JP | 9-064571 | 3/1997 |
| JP | 9-082081 | 3/1997 |
| JP | 2635127 B2 | 7/1997 |
| JP | 9-306094 | 11/1997 |
| JP | H09-319466 A | 12/1997 |
| JP | 10-040021 | 2/1998 |
| JP | 10-049365 | 2/1998 |
| JP | 10-064173 | 3/1998 |
| JP | 10-098521 | 4/1998 |
| JP | 2771297 B2 | 7/1998 |
| JP | 10-275137 | 10/1998 |
| JP | 10-281799 | 10/1998 |
| JP | 10-320128 | 12/1998 |
| JP | 10-340139 | 12/1998 |
| JP | 2862679 B2 | 3/1999 |
| JP | 11-134852 | 5/1999 |
| JP | 11-139839 | 5/1999 |
| JP | 2906930 B2 | 6/1999 |
| JP | 11-203201 | 7/1999 |
| JP | 11-213182 | 8/1999 |
| JP | 11-327800 | 11/1999 |
| JP | 11-353128 | 12/1999 |
| JP | 11-353129 | 12/1999 |
| JP | 3-008086 B2 | 2/2000 |
| JP | 2000-056935 A | 2/2000 |
| JP | 2000-066845 A | 3/2000 |
| JP | 2000-112831 A | 4/2000 |
| JP | 2000-113563 A | 4/2000 |
| JP | 2000-114759 A | 4/2000 |
| JP | 2000-125290 A | 4/2000 |

(56) References Cited

FOREIGN PATENT DOCUMENTS

| | | |
|---|---|---|
| JP | 2000-132704 A | 5/2000 |
| JP | 2000-149431 A | 5/2000 |
| JP | 3052183 B2 | 6/2000 |
| JP | 2000-228686 A | 8/2000 |
| JP | 2000-235762 A | 8/2000 |
| JP | 2000-236188 A | 8/2000 |
| JP | 2000-242598 A | 9/2000 |
| JP | 2000-278647 A | 10/2000 |
| JP | 3097994 B2 | 10/2000 |
| JP | 2000-305860 A | 11/2000 |
| JP | 2001-005501 A | 1/2001 |
| JP | 2001-023270 A | 1/2001 |
| JP | 2001-100925 A | 4/2001 |
| JP | 3-207947 B2 | 9/2001 |
| JP | 3-210662 B2 | 9/2001 |
| JP | 3-212859 B2 | 9/2001 |
| JP | 3-214490 B2 | 10/2001 |
| JP | 3-240821 B2 | 12/2001 |
| JP | 2002-42446 | 2/2002 |
| JP | 3-295071 B2 | 6/2002 |
| JP | 2007087498 A | 4/2007 |
| JP | 2007-188615 A | 7/2007 |
| JP | 2007-220184 A | 8/2007 |
| JP | 2007-293936 A | 11/2007 |
| JP | 2007-305206 A | 11/2007 |
| JP | 2007-305290 A | 11/2007 |
| JP | 4-017134 B2 | 12/2007 |
| JP | 2007-328761 A | 12/2007 |
| JP | 2008-503824 A | 2/2008 |
| JP | 4-143989 B2 | 9/2008 |
| JP | 4-172658 B2 | 10/2008 |
| JP | 4-214288 B2 | 1/2009 |
| JP | 4-247385 B2 | 4/2009 |
| JP | 4-259956 B2 | 4/2009 |
| JP | 4-307440 B2 | 8/2009 |
| JP | 4-325923 B2 | 9/2009 |
| JP | 5-035053 B2 | 9/2012 |
| JP | 5-035415 B2 | 9/2012 |
| JP | 5-066896 B2 | 11/2012 |
| JP | 5-068257 B2 | 11/2012 |
| JP | 5-073566 B2 | 11/2012 |
| JP | 5-073803 B2 | 11/2012 |
| JP | 5-101603 B2 | 12/2012 |
| JP | 5-173718 B2 | 4/2013 |
| JP | 5-189163 B2 | 4/2013 |
| JP | 5-204725 B2 | 6/2013 |
| JP | 5-223551 B2 | 6/2013 |
| KR | 1998-0035445 A | 8/1998 |
| KR | 10-0176527 | 11/1998 |
| KR | 10-0214308 B1 | 8/1999 |
| KR | 10-0403039 B1 | 10/2003 |
| KR | 10-2007-0024354 A | 3/2007 |
| KR | 101369263 B1 * | 3/2014 |
| SG | 45223 A1 | 1/1998 |
| TW | 387574 U | 4/2000 |
| WO | WO-89/01682 A1 | 2/1989 |
| WO | WO-97/06532 A1 | 2/1997 |
| WO | WO-00/49487 A1 | 8/2000 |
| WO | WO-00/67253 A1 | 11/2000 |
| WO | WO-01/09627 A2 | 2/2001 |
| WO | WO-01/41148 A1 | 6/2001 |
| WO | WO-03/013783 A1 | 2/2003 |
| WO | WO-03/021597 A1 | 3/2003 |
| WO | WO-03/021598 A1 | 3/2003 |
| WO | WO-03/067385 A2 | 8/2003 |
| WO | WO-2004/006260 A1 | 1/2004 |
| WO | WO-2004/114286 A1 | 12/2004 |
| WO | WO-2005/024830 A1 | 3/2005 |
| WO | WO-2005/024831 A1 | 3/2005 |
| WO | WO-2005/109131 A1 | 11/2005 |
| WO | WO-2006/030185 A1 | 3/2006 |
| WO | WO-2006/048611 A1 | 5/2006 |
| WO | WO-2006/100441 A1 | 9/2006 |
| WO | WO-2006/100445 A1 | 9/2006 |
| WO | WO-2007/031729 A1 | 3/2007 |

OTHER PUBLICATIONS

Abraham et al., "Thermal Proximity Imaging of Hard-Disk Substrates", IEEE Transactions on Mathematics 36:3997-4004, Nov. 2000.

Abramovitch, "Rejecting Rotational Disturbances on Small Disk Drives Using Rotational Accelerometers", Proceedings of the 1996 IFAC World Congress in San Francisco, CA, 8 pages (Jul. 1996).

Ali et al., "Modeling and Simulation of Hard Disk Drive Final Assembly Using a HDD Template" Proceedings of the 2007 Winter Simulation Conference, IEEE pp. 1641-1650 (2007).

Anderson et al., "Clinical chemistry: concepts and applications", The McGraw-Hill Companies, Inc., pp. 131-132, 2003.

Anderson et al., "High Reliability Variable Load Time Controllable Vibration Free Thermal Processing Environment", Delphion, 3 pages (Dec. 1993). hhtps://www.delphion.com/tdbs/tdb?order=93A +63418 (retrieved Mar. 18, 2009).

Asbrand, "Engineers at One Company Share the Pride and the Profits of Successful Product Design", Professional Issues, 4 pages, 1987.

Bair et al., "Measurements of Asperity Temperatures of a Read/Write Head Slider Bearing in Hard Magnetic Recording Disks", Journal of Tribology 113:547-554, Jul. 1991.

Biber et al., "Disk Drive Drawer Thermal Management", Advances in Electronic Packaging vol. 1:43-46, 1995.

Bakken et al., "Low Cost, Rack Mounted, Direct Access Disk Storage Device", Delphion, 2 pages (Mar. 1977). http://www.delphion.com/tdbs/tdb (retrieved Mar. 3, 2005).

Christensen, "How Can Great firms Fail? Insights from the hard Disk Drive Industry", Harvard Business School Press, pp. 1-26, 2006.

Chung et al., "Vibration Absorber for Reduction of the In-plane Vibration in an Optical Disk Drive", IEEE Transactions on Consumer Electronics, Vo. 48, May 2004.

Curtis et al., "InPhase Professional Archive Drive Architecture", InPhase Technologies, Inc., 6 pages (Dec. 17, 2007) http://www.science.edu/TechoftheYear/Nominees/InPhase.

Exhibit 1 in *Xyratex Technology, LTD v. Teradyne, Inc.*; Newspaper picture that displays the CSO tester; 1990.

Exhibit 1314 in *Xyratex Technology, LTD. v. Teradyne, Inc.*; Case, "Last products of Disk-File Development at Hursley and Millbrook," IBM, Oct. 12, 1990.

Exhibit 1315 in *Xyratex Technology, LTD. v. Teradyne, Inc.*; Case, "History of Disk-File Development at Hursley and Millbrook," IBM, Oct. 17, 1990.

Exhibit 1326 in *Xyratex Technology, LTD. v. Teradyne, Inc.*; Image of the back of Exhibit 1 and Exhibit 2 photos, which display the photos dates; 1990.

Exhibit 2 in *Xyratex Technology, LTD. v. Teradyne, Inc.*; Photos of the CSO tester obtained from Hitachi; 1990.

Findeis et al., "Vibration Isolation Techniques Sutiable for Portable Electronic Speckle Pattern Interferometry", Proc. SPIE vol. 4704, pp. 159-167, 2002 http://www.ndt.uct.ac.za/Paoers/soiendt2002.odf.

FlexStar Technology, "A World of Storage Testing Solutions," http://www.flexstar.com, 1 page (1999).

FlexStar Technology, "Environment Chamber Products," http://www.flexstar.com, 1 page (1999).

FlexStar Technology, "FlexStar's Family of Products," http://www.flexstar.com, 1 page (1999).

FlexStar Technology, 30E/Cascade Users Manual, Doc #98-36387-00 Rev. 1.8, pp. 1-33, Jun. 1, 2004.

Frankovich, "The Basics of Vibration Isolation Using Elastomeric Materials", Aearo EAR Specialty Composites, 8 pages (2005) http://www.isoloss.com/11dfs/engineering/BasicsoNibrationisolation.

Grochowski et al., "Future Trends in Hard Disk Drives", IEEE Transactions on Magnetics, 32(3): 1850-1854 (May 1996).

Gurumurthi et al., "Disk Drive Roadmap from the Thermal Perspective: A Case for Dynamic Thermal Management", International Symposium on Computer Architecture Proceedings of the 32nd

(56) References Cited

OTHER PUBLICATIONS

Annual International Symposium on Computer Architecture, Technical Report CSE-05-001, pp. 38-49 (Feb. 2005).
Gurumurthi et al., "Thermal Issues in Disk Drive Design: Challenges and Possible Solutions", ACM Transactions on Storage, 2(1): 41-73 (Feb. 2006).
Gurumurthi, "The Need for temperature-Aware Storage Systems", The Tenth Intersociety conference on Thermal and Thermomechanical Phenomena in Electronics, pp. 387-394, 2006.
Haddad et al., "A new Mounting Adapter for Computer Peripherals with Improved Reliability, Thermal Distribution, Low Noise and Vibration Reduction", ISPS, Advances in Information Storage and Processing Systems, 1:97-108, 1995.
Henderson, "HAD High Aerial Densities Require Solid Test Fixtures", Flexstar Technology, 3 pages (Feb. 26, 2007).
HighBeam Research website "ACT debuts six-zone catalytic gas heater. (American Catalytic Technologies offers new heaters)", 4 pages (Oct. 26, 1998). http://www.highbeam.com.
HighBeam Research website "Asynchronous Testing Increases Throughput", 7 pages (Dec. 1, 2000). http://www.highbeam.com.
HighBeam Research website "Credence announces Production Release of the EPRO AQ Series for Integrated Test and Back-end Processing", 4 pages (1995). http://www.highbeam.com.
HighBeam Research website "Test Multiple Parts at Once for Air Leaks. (Brief Article)", 1 page (1999) http://www.highbeam.com.
Iwamiya, "Hard Drive Cooling Using a Thermoelectric Cooler", EEP—vol. 19-2, Advances in Electronic Packaging, vol. 2:2203-2208, ASME 1997.
Johnson et al., "Performance Measurements of Tertiary Storage Devices", Proceedings of the 24th VLDB Conference, New York, pp. 50-61, 1998.
Ku, "Investigation of Hydrodynamic Bearing Friction in Data Storage information System Spindle Motors", ISPSvol. 1, Advances in Information Storage and Processing Systems, pp. 159-165, ASME 1995.
Lindner, "Disk drive mounting", IBM Technical Disclosure Brochure, vol. 16, No. 3, pp. 903-904, Aug. 1973.
Low, Y.L. et al., "Thermal network model for temperature prediction in hard disk drive", Microsyst Technol, 15: 1653-1656 (2009).
McAuley, "Recursive Time Trapping for Synchronization of Product and Chamber Profiles for Stress Test", Delphion, 3 pages (Jun. 1988), https://www.delphion.com/tdbs/tdb, (retrieved Mar. 18, 2009).
Morgenstern, Micropolis Drives Target High-end Apps; Technology Provides Higher Uninterrupted Data Transfer. (Applications; Microdisk AV LS 3020 and 1050AV and I 760AV LT Stackable Hard Drive Systems) (Product Announcement) MacWeek, vol. 8, No. 6, p. 8; Feb. 7, 1994.
Morris, "Zero Cost Power and Cooling Monitor System", 3 pages (Jun. 1994) https://www.delphion.com/tdbs/tdb (retrieved Jan. 15, 2008).
Nagarajan, "Survey of Cleaning and cleanliness Measurement in Disk Drive Manufacture", North Carolina Department of Environment and Natural Resources, 13-21 (Feb. 1997).
Park, "Vibration and Noise Reduction of an Optical Disk Drive by Using a Vibration Absorber Methods and Apparatus for Securing Disk Drives in a Disk", IEEE Transactions on Consumer Electronics, vol. 48, Nov. 2002.
Prater et al., "Thermal and Heat-Flow Aspects of Actuators for Hard Disk Drives", InterSociety Conference on Thermal Phenomena, pp. 261-268, 1994.
Ruwart et al., "Performance Impact of External Vibration on Consumer-grade and enterprise-class Disk Drives", Proceedings of the 22nd IEEE/13th Goddard Conference on Mass Storage Systems and Technologies, 2005.
Schroeder et al., "Disk Failures in the Real World: What does an MTTP of 1,000,000 hours mean to you?", In FAST'07: 5th USENIX Conference on File and Storage Technologies, San Jose, CA, Feb. 14-16, 2007.
Schulze et al., "How Reliable is a Raid?," COMPCON Spring apos; 89. Thirty-Fourth IEEE Computer Society International Conference: Intellectual Leverage, Digest of papers; pp. 118-123, Feb. 27-Mar. 3, 1989.
Seagate Product Marketing, "Seagate's Advanced Multidrive System (SAMS) Rotational Vibration Feature", Publication TP-229D, Feb. 2000.
Suwa et al., "Evaluation System for Residual Vibration from HDD Mounting Mechanism" IEEE Transactions on Magnetics, vol. 35, No. 2, pp. 868-873, Mar. 1999.
Suwa et al., "Rotational Vibration Suppressor" IBM Technical Disclosure Bulletin Oct. 1991.
Terwiesch et al., "An Exploratory Study of International Product Transfer and Production Ramp-Up in the Data Storage Industry", The Information Storage Industry Center, University of California, pp. 1-31, 1999. www-iros.ucsd.edu/sloan/.
Tzeng, "Dynamic Torque Characteristics of Disk-Drive Spindle Bearings", ISPS—vol. 1, Advances in Information Storage and Processing Systems, pp. 57-63, ASME 1995.
Tzeng, "Measurements of Transient Thermal Strains in a Disk-Drive Actuator", InterSociety conference on Thermal Phenomena, pp. 269-274, 1994.
Wilson—7000 disk Drive Analyzer Product Literature, date accessed Jan. 28, 2009, 2 pages.
Winchester, "Automation Specialists Use Machine Vision as a System Development Tool", IEE Computing & Control Engineering, Jun./Jul. 2003.
Xyratex Product Test brochure, "Automated Production Test Solutions", 2006.
*Xyratex Technology, LTD.* v. *Teradyne, Inc.*, Amended Joint Trial Exhibit List of Xyratex and Teradyne. Case No. CV 08-04545 SJO (PLAx), Nov. 12, 2009.
*Xyratex Technology, LTD.* v. *Teradyne, Inc.*, Teradyne, Inc's Prior Art Notice Pursuant to 35; U.S.C. Section 282. Case No. CV 08-04545 SJO (PLAx), Oct. 16, 2009.
Xyratex to Debut its New Automated Test Solution for 2.5-Inch Disk Drives at DISKCON USA 2004, PR Newswire Europe (2004).
Xyratex, "Continuous Innovation—Production Test Systems"www.xyratex.com/Products/production-test-system (1995-2008).
Xyratex, "Key Advantages—Production Test Systems" www.xyratex.com/Products/production-test-system (1995-2008).
Xyratex, "Process Challenges in the Hard Drive Industry" slide presentation, Asian Diskcon (2006).
Xyratex, "Production Test Systems" www.xyratex.com/Products/production-test-system (1995-2008).
Xyratex, "Single cell—Production Test Systems" www.xyratex.com/Products/production-test-system (1995-2008).
Xyratex, "Storage Infrastructure" www.xyratex.com/Products/storage-infrastructure/default.aspx (1995-2008).
Xyratex, "Testing Drives Colder - Production Test Systems" www.xyratex.com/Products/production-test-system (1995-2008).
U.S. Appl. No. 15/688,048, filed Aug. 28, 2017, Automated Test System Having Orthogonal Robots.
U.S. Appl. No. 15/688,073, filed Aug. 28, 2017, Automated Test System Having Multiple Stages.
U.S. Appl. No. 15/688,104, filed Aug. 28, 2017, Automated Test System Employing Robotics.
U.S. Appl. No. 15/688,112, filed Aug. 28, 2017, Calibration Process for an Automated Test System.
U.S. Appl. No. 16/105,179, filed Aug. 20, 2018, Carrier-Based Test System.
International Preliminary Report on Patentability for International Application No. PCT/US2019/019494, dated Nov. 5, 2020, (8 pages).
International Search Report for International Application No. PCT/US2019/019494, dated Jun. 12, 2019, (3 pages).
Written Opinion for International Application No. PCT/US2019/019494, dated Jun. 12, 2019, (7 pages).

\* cited by examiner

SYSTEM FOR TESTING DEVICES INSIDE OF CARRIERS

TECHNICAL FIELD

This specification relates generally to thermal control in a test system.

BACKGROUND

Test systems are configured to test the operation of electronic devices, such as microprocessors. Some types of electronic devices generate considerable heat during operation, including during testing. The heat generated, if not properly dissipated, can cause damage to the device, adversely affect test results, or both.

SUMMARY

An example test system includes a carrier having a test socket to receive a device to test. The test socket on the carrier includes electrical connections. The test system also includes a lid assembly comprised of a socket cap to contact the device to apply pressure to cause the device to connect electrically to the electrical connections. The socket cap includes a material having a thermal conductivity that exceeds a defined value. The lid assembly also includes one or more structures configured to provide surface area over which heat from the device dissipates. The one or more structures are comprised of a material having a thermal conductivity that exceeds the defined value. The example test system may include one or more of the following features, either alone or in combination.

The one or more structures may comprise fins that are connected thermally to the device via the socket cap. The fins may extend away from the device. The fins may be arranged in one or more rows. The fins and the socket cap may be integrated into a single structure comprising the lid assembly. The fins may include, or be, metal.

The example test system may comprise a test slot to receive the carrier. The test slot may comprise an interface to which the carrier connects electrically. The test slot may comprise an air mover that is configured to move air over the lid assembly. The carrier may comprise a second test socket to hold a second device to test.

The example test system may comprise a thermal control chamber comprising air maintained at a temperature, and a test rack to hold the test slot among multiple test slots. The test rack may comprise one or more air movers configured move air into the thermal control chamber. The temperature may be ambient temperature.

The example test system may comprise a test slot to receive the carrier. The test slot may comprise an interface to which the carrier connects electrically. The test system may comprise robotics to move the carrier into, and out of, the test slot.

The example test system may comprise an actuator that is configured to engage the socket cap for placement over the device or for removal from over the device. The actuator may comprise a key element that is rotatable; tooling balls arranged relative to the key element; and a block. The tooling balls may be fixed to the block. The key element may pass through the block and being movable relative to the block.

The socket cap may comprise a kinematic mount. The kinematic mount may comprise: a first structure comprising grooves that are configured and arranged to engage the tooling balls, with the first structure having a hole, and with the hole and the key element having complementary shapes to allow the key element to pass through the hole; and a second structure having a hole, with the hole and the key element having complementary shapes to allow the key element to pass through the hole, and with the key element being configured to rotate to engage the second structure. The kinematic mount may comprise at least one compression spring that is controllable by the first structure and the second structure.

The actuator may be configured or operated to cause operations comprising: the actuator engages the socket cap forcing the tooling balls against the grooves and causing the key element to pass through the first and second structures; the actuator rotates the key element; the key element pulls against the second element while the tooling balls pushes against the grooves to compress the compression spring; the actuator moves the socket cap in place over the device causing the socket cap to connect to the test carrier; and following connection of the socket cap to the test carrier, the actuator retracts.

An example test system comprises an atrium containing air maintained at a temperature; a test slot configured to receive the air from the atrium, with the test slot comprising at least one air mover for moving the air from the atrium through the test slot; and a carrier having test sockets for insertion into the test slot, with each test socket being configured to receive a device to test. The carrier comprises structures that are thermally connected to the device. The structures are for providing surface area over which to dissipate heat from the device. The structures comprise a material having a thermal conductivity that exceeds a defined value. The at least one air mover is configured to move the air through the structures. The example test system may include one or more of the following features, either alone or in combination.

The structures may comprise fins extending away from the device. The fins may be arranged in one or more rows. The fins may include, or be made of, metal.

The example test system may include a socket cap to fit over the device in the test socket. The structures and the socket cap may be a single part comprising a lid assembly for the carrier. The test system may include multiple test slots. Each of the multiple test slots may be configured to receive a separate carrier. Each carrier may be configured to hold one or more devices. The test system may include a control system comprising a proportional, integral, derivative (PID) controller. The PID controller is configured to control, separately, temperatures of devices in different carriers.

Any two or more of the features described in this specification, including in this summary section, can be combined to form implementations not specifically described herein.

The systems and techniques and processes described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and techniques and processes described herein, or portions thereof, can be implemented as an apparatus, method, or electronic system that can include one or more processing devices and memory to store executable instructions to implement various operations.

The details of one or more implementations are set forth in the accompanying drawings and the description below.

Other features, objects, and advantages will be apparent from the description and drawings, and from the claims.

DESCRIPTION OF THE DRAWINGS

Like reference numerals in different figures indicate like elements.

DETAILED DESCRIPTION

Figure 1:
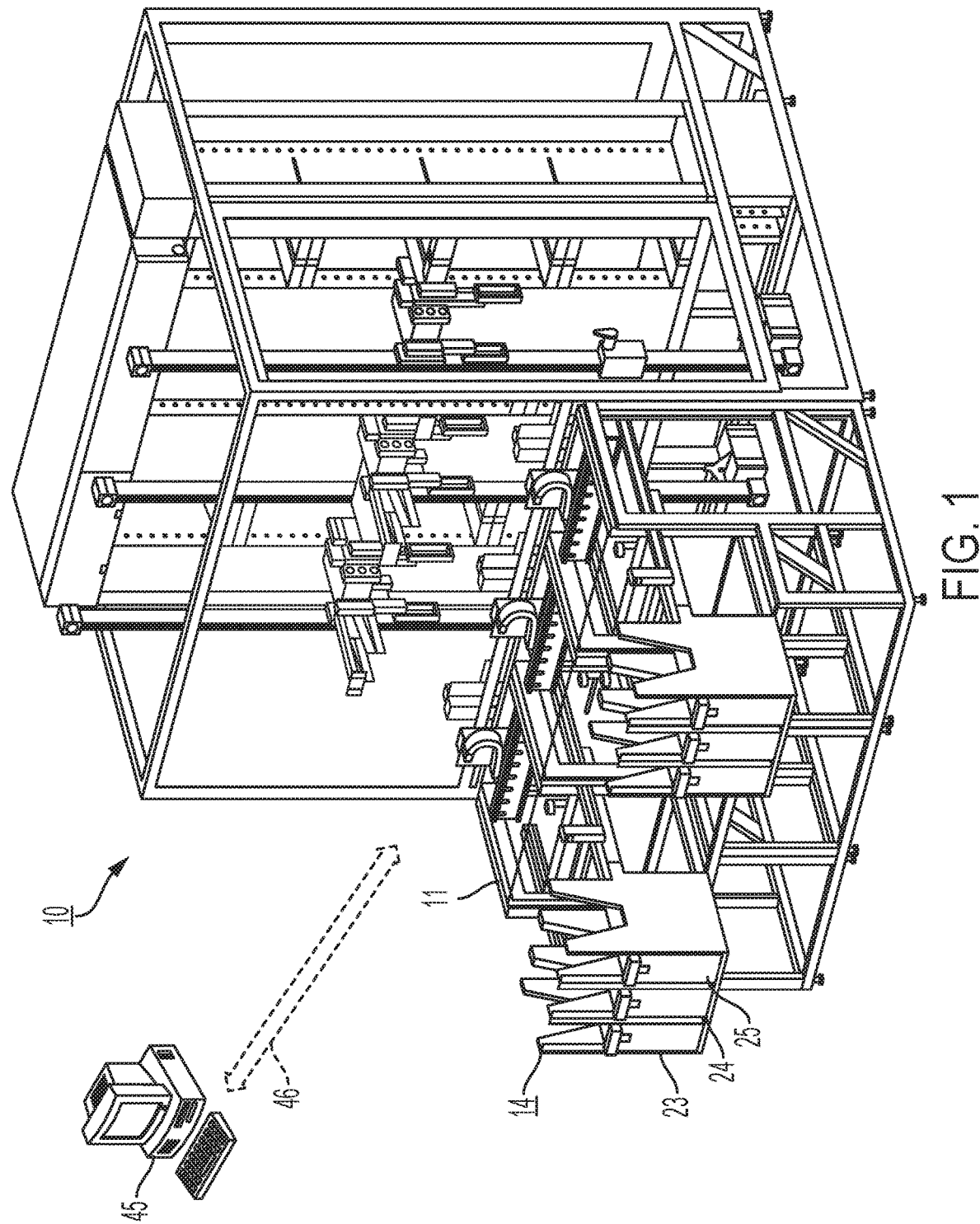
FIG. 1 is a perspective view of an example test system.

Described herein are example implementations of a carrier-based test system. An example carrier-based test system includes, among other components, a carrier having one or more test sockets, each to receive a device to test. A device being tested is referred to as a device under test, or DUT. The test socket includes electrical connections to connect to the device. The system also includes a lid assembly that fits onto a corresponding test socket. An example lid assembly includes a socket cap. The socket cap is configured to contact the device in the test socket and to apply pressure to cause the device to connect electrically to electrical connections in the test socket. These electrical connections enable the test system to exchange signals with the device during testing. The socket cap is made of, or includes, a material, such as metal, having a thermal conductivity that exceeds a defined value. The example lid assembly may include one or more structures—such as, but not limited to, fins—that are made of, or include, a material, such as metal, having a thermal conductivity that exceeds the defined value. Heat may be transferred from the device, through the socket cap and fins. The fins are configured to provide surface area over which the heat from the device dissipates during test or at other appropriate times. For example, the thermal conductivities of the various components may be sufficient to dissipate, in whole or part, heat from the device through the socket cap and outward through the fins.

The heat dissipation achieved in the example carrier-based test system reduces the chances that the device will overheat during testing and be damaged as a result, or that testing will be adversely affected due to excess heat generated by the device. Thus, the carrier-based test system can test devices operating at relatively high power, which typically generate more heat than devices that operate at lower powers. Examples of high-power devices include, but are not limited to, devices that operate at over 4 Watts (W), over 10 W, over 20 W, and so forth. Some types of microprocessors may be characterized as high-power devices. The carrier-based test system, however, is not limited to testing high-power devices or to testing microprocessors, and may be used to test, and to dissipate heat from, any appropriate device. As described below, the carrier-based test system may also be configured to add heat to a device.

The carrier-based test system also uses convection to assist in thermal control. In an example, one or more air movers are positioned to move air from a thermal atrium, such as a cool atrium, over a carrier containing a device during test. In some implementations, the air is relatively cool and moves over, and through, the fins, drawing heat from the fins and causing the device to cool. In some implementations, a first air mover, such as a fan, is positioned to direct thermally-controlled air into the thermal atrium. A second air mover, such as a fan, is positioned in a test slot housing the carrier. The two air movers operate to draw cool air from the thermal atrium, to cause the cool air to pass over and through the fins to cause the cool air to heat, and to draw the resulting heated air out of the test slot and into a surrounding environment.

The carrier-based test system may be, but is not necessarily, a system-level test (SLT) system. System-level testing involves testing an entire device, rather than individual components of the device. If the device passes a battery of system-level tests, it is assumed that the individual components of the device are operating properly. SLT has become more prevalent as the complexity of, and number of components in, devices have increased. For example, a chip-implemented system, such as an application-specific integrated circuit (ASIC), may be tested on a system level in order to determine that components that comprise the chip are functioning correctly.

In some implementations, the example test system is modular, enabling the test system to accommodate various testing requirements. Each unit of the test system is referred to as a slice. Two or more slices may be combined and controlled to operate in concert (e.g., dependently) or independently to perform testing operations.

Figure 2:
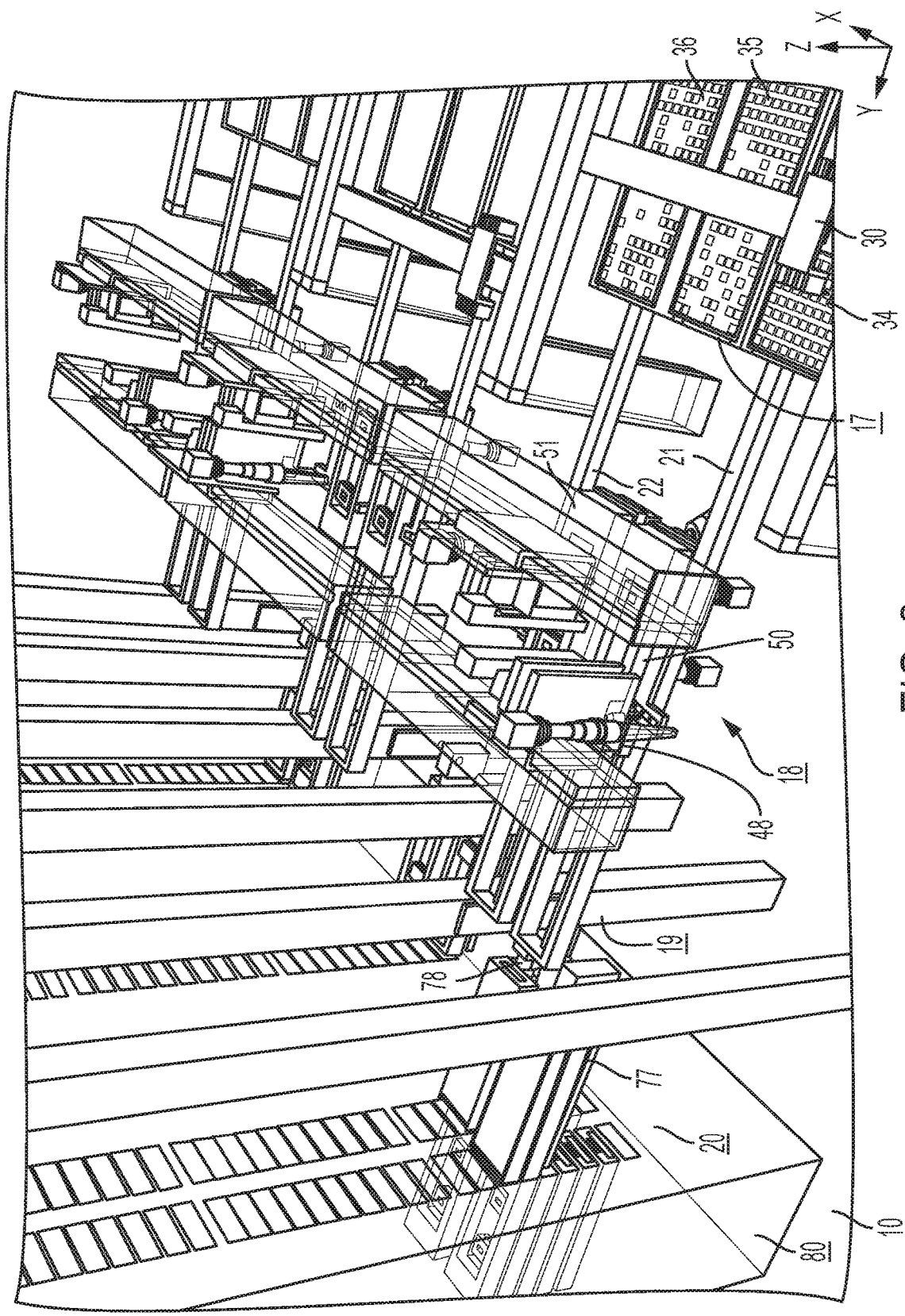
FIGS. 2 and 3 are perspective views showing examples of internal components of the test system of FIG. 1 at different configurations during operation.

Referring to FIGS. 1 and 2, example test system 10 includes five stages (or zones) per slice; however, any appropriate number of stages may be included in the test system. In an example implementation, the five stages include an input/output (I/O) stage 14 a transport stage 17, a loading stage 18, an insertion stage 19, and a test stage 20. The definitions of the various stages are not meant to be limiting, and one or more components may perform functions in two or more of the stages. In some implementations, different stages are configured to operate with different levels of precision. For example, higher levels of precision (e.g., down to the micron level) may be used in the loading stage, whereas lower levels of precision may be used in some or all other stages. System components, such as mechanical components, may be configured for operation within tolerances that enable lower levels of precision in some stages. By relegating higher precision to stages that may require it, the cost and complexity of the test system can be controlled in some cases.

Computing system 45 communicates with test system 10 to control, and to coordinate operations of, test system 10. Computing system 45 may include one or more processing devices, examples of which are described herein. Communications between test system 10 and computing system 45 are represented by dashed arrow 46.

The different stages of the test system may operate independently and contemporaneously. In the example of FIG. 2, each stage includes two parallel paths 21 and 22.

Each of the parallel paths includes automation, such as robotics, to pass carriers, devices, or both between adjacent stages. Operation of the different stages independently, contemporaneously, and in the parallel paths may support higher testing throughput and speed than some comparable test systems In the example of FIG. 1, I/O stage 14 includes, but is not limited to, feeders for receiving trays of tested devices, and for providing trays of untested devices to the test system. In the example of FIG. 1, there are three feeders 23, 24, 25 per slice; however, the system is not limited to use with three feeders. A first feeder 23 is for trays containing untested devices; a second feeder 24 is for trays containing tested devices that have not passed testing, and a third feeder 25 is for trays containing devices that have passed testing. In this example, feeder 23 is loaded manually with trays of untested devices. A tray among a stack of trays containing untested devices is fed from feeder 23 to the transport stage 17. After all devices on that tray have been forwarded for testing, and the tray is empty, the tray is retracted into the feeder and a new tray containing untested devices is fed to the transport stage. After devices have been loaded onto that tray following testing, and the tray is full (in some implementations), the tray is retracted into the feeder and a new, empty tray is fed from the I/O stage to the transport stage from either feeder 24 or 25. In this example, operations of feeders 24 and 25 are the same for trays containing devices that have passed testing and trays containing devices that have not passed testing.

Figure 3:
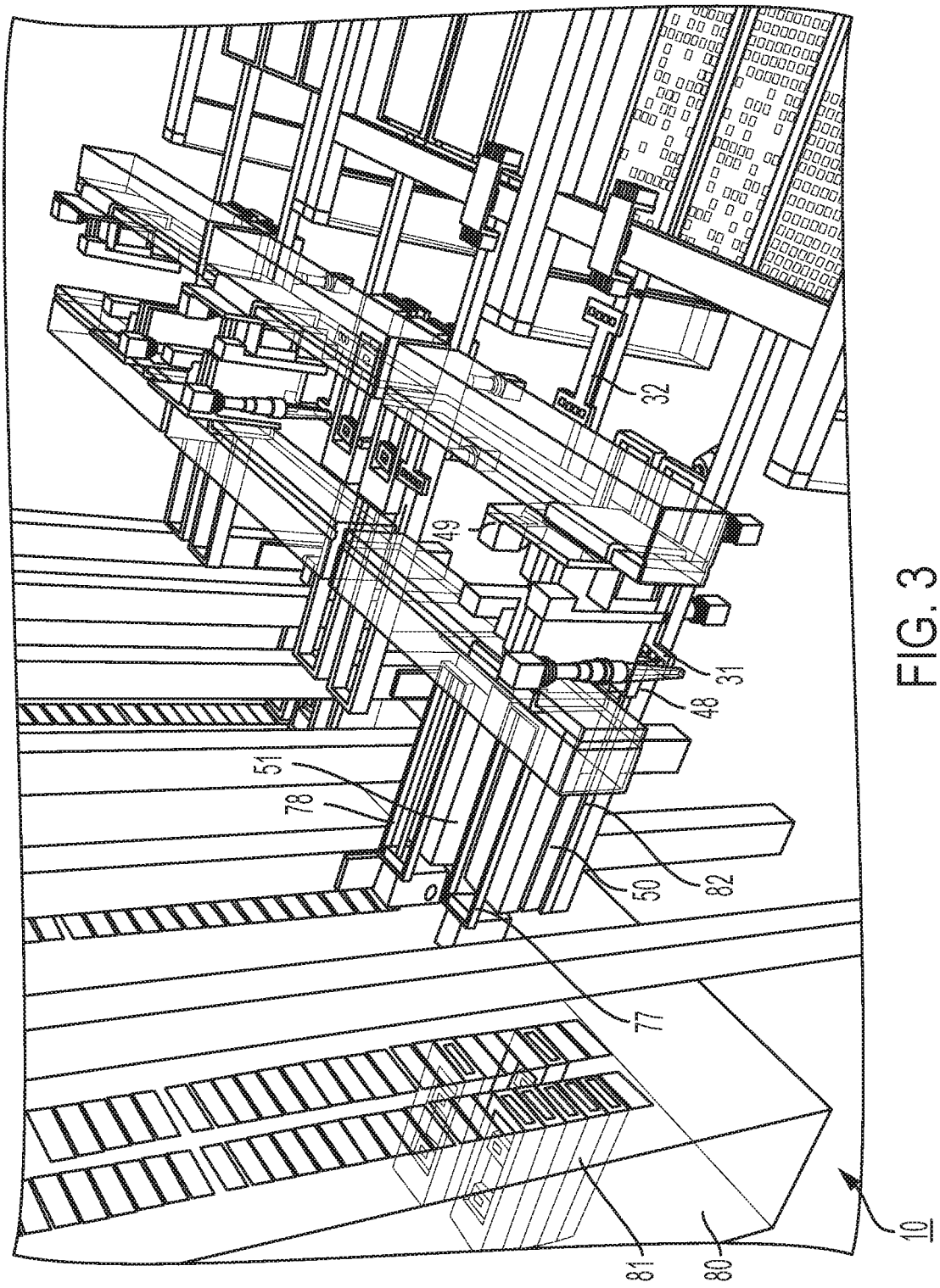

In this example, transport stage 17 includes, but is not limited to, a transport robot 30 (e.g., FIG. 2) and two device shuttles 31, 32 (e.g., FIG. 3). The two device shuttles provide parallel transport paths, both into, and out of, the loading stage 18 described below, and support testing throughput and redundant reliability in some examples. Transport robot 30 is controllable to pick untested devices from a tray 34 (e.g., FIG. 2) and to place the untested devices onto device shuttles 31 and/or 32 (e.g., FIG. 3). Transport robot 30 is controllable to pick tested devices from device shuttles 31 and 32, and to place the tested devices into an appropriate one of trays 35 or 36, depending upon whether a particular device has passed testing or has not passed testing. In some implementations, transport robot 30 may pick and hold the device through air suction or using mechanical grips or other mechanical mechanisms.

In some implementations, the two devices shuttles may be configured and controlled to operate in parallel, independently, contemporaneously, and/or concurrently. For example, the transport robot may provide one device shuttle with devices to be tested, while removing devices that have been tested from another device shuttle. The two devices shuttles may be configured to move between the loading stage and the transport stage independently, in parallel, contemporaneously, and/or concurrently. For example, one device shuttle may transport devices to be tested from the transport stage towards, and to, the loading stage, while the other device shuttle transports devices that have been tested away from the loading stage and to the transport stage. In addition, one device shuttle may be stationary while the other device shuttle is moving. For example, one device shuttle may receive devices to be tested while the other device shuttle transports devices to or from the loading stage.

In some implementations, loading stage 18 includes, but is not limited to, loading robots 48, 49 and an area for loading devices into, and unloading devices from, test carriers, such as 50 and 51. In this example, there are two loading robots per slice; however, the test system may include any appropriate number of loading robots. In this example, loading robots 48, 49 are configured to move in the X dimension and also in the Z dimension to perform pick-and-place operations on devices. For example, untested devices are picked-up from a shuttle and moved into a carrier for testing, and tested devices are picked-up from a carrier and moved to a shuttle.

In the example of FIGS. 2 and 3, two test arms 77, 78 are shown per slice; however, the test system may include any appropriate number of test arms. The test arms are movable in all three dimensions—X, Y and Z, including rotations and flipping, in order to insert test carriers containing untested device into test slots in the test rack, and to extract, or to remove, test carriers containing tested devices from the test slots in the test rack. Carriers containing tested devices are moved back to the loading stage, where the devices are unloaded onto shuttles by the loading robots.

Each test arm is configured to hold two test carriers at the same time—one on each face or side of the test arm. In some implementations, each side of a test arm (e.g., 77 or 78) includes a carrier-holding receptacle, such as a gripper, for receiving, for holding, and for releasing a test carrier. In an example, the gripper is spring-loaded to accept a test carrier containing untested devices from a carrier shuttle, and to release a test carrier containing tested to device to the (same or different) carrier shuttle. The carrier shuttle may be configured to control opening and closing of each gripper. A carrier shuttle 82 may move the carrier between the test arm and loading position.

Test rack 80 includes multiple test slots. Carriers 81 are shown inside corresponding slots of the test rack. Each test slot may be configured and controllable to test devices in the test sockets on a test carrier, and to report the test results back to the computing system controlling the test system. The computing system keeps track of which devices passed testing and which devices failed testing, sorts the devices accordingly, and reports the test results. A test slot in the test rack is serviced by a test arm. In some implementations, during testing, a test slot always remains occupied except for the short time during which test carriers are exchanged in the test slot. For example, a test arm 77 or 78 may arrive at a test slot while holding a test carrier containing untested devices, extract a test carrier containing tested devices from the test slot, and insert the test carrier containing untested devices into that same test slot from which the other test carrier was extracted. Thus, except for the time between the removal and insertion of the test carriers, the test slot remains occupied. Each test slot in the test rack may be serviced in this manner to enhance testing throughput. Examples of how test carriers are inserted and extracted are provided below.

In operation, a test arm 77 or 78 moves—e.g., flips and rotates—to position itself to pick-up a test carrier containing untested devices from a carrier shuttle such as carrier shuttle 50, and to deposit the test carrier containing tested devices onto the (same or different) carrier shuttle. In this example, the test carrier rotates (e.g., about) 180° and flips. The rotation is about a longitudinal axis of the test arm and the flipping includes a rotation in the X dimension. As a result of this movement, an empty, first gripper on the test arm is in position to pick-up a test carrier containing untested devices from the carrier shuttle. Accordingly, the first gripper is controlled to pick-up the test carrier containing untested devices from the carrier shuttle. The test arm then rotates along its longitudinal axis at a point above, or proximate to, the carrier shuttle to position a test carrier containing tested devices for deposit onto the carrier shuttle.

A second gripper on the test arm that is holding the test carrier is opened, resulting in the test carrier containing the tested devices being deposited on the carrier shuttle. Thereafter, the carrier shuttle transports the test carrier containing the tested devices to the loading stage.

At this time, therefore, the second gripper is empty and the first gripper holds a test carrier containing untested devices. Accordingly, the test arm rotates and flips to position the test arm to service a test slot. The test arm may also move vertically to position itself in front of a target test slot to be serviced. This rotation and flipping is opposite to the rotation and flipping performed to position the test arm above the carrier shuttle. Thus, the test arm is positioned to extract, or to receive, from the target test slot, a test carrier containing devices that have been tested. The test carrier containing devices that have been tested is received into the theretofore empty second gripper. Following receipt of the test carrier containing devices that have been tested, the test arm rotates to position the test carrier in the first gripper, which contains devices that have not been tested, into position for insertion into the same test slot. Thereafter, the test carrier containing devices that have not been tested is pushed into that test slot, and the foregoing operations are repeated, slot-by-slot.

Example implementations of a system like that of FIGS. 1 to 3 are described in U.S. patent application Ser. No. 15/688,112, which was filed on Aug. 28, 2017 and titled "Calibration Process For An Automated Test System. U.S. patent application Ser. No. 15/688,112 is incorporated herein by reference. For example, the robotics and other components of input/output (I/O) stage 14 a transport stage 17, a loading stage 18, an insertion stage 19, and a test stage 20 are incorporated by reference into this application from U.S. patent application Ser. No. 15/688,112.

Figure 4:
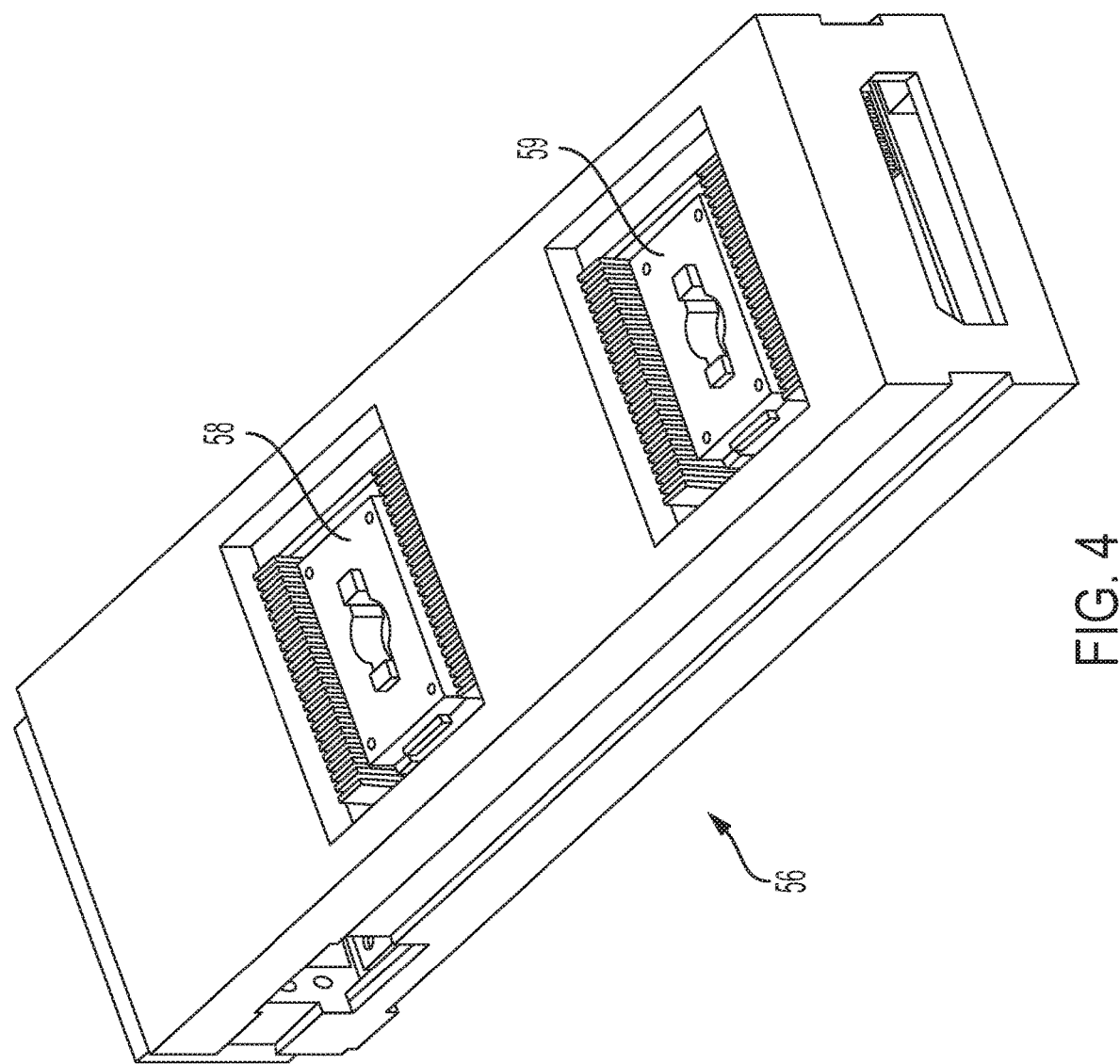
FIG. 4 is a perspective view of an example carrier for the test system.

FIG. 4 shows an example of a test carrier 56. In some implementations, test sockets and electronics are included in the test carrier, which is self-contained, portable, and removable. In some implementations, the test carrier includes an electrical interface that is configurable to connect to devices in the test carrier. For example, the interface can be configured to connect to a variety of different electrical interfaces. In the example of FIG. 4, test carrier 56 includes two test sockets 58, 59 arranged along the test carrier's longitudinal dimension. Although two test sockets are shown in the example of FIG. 4, other implementations of the test carrier may contain more, or fewer than, two test sockets. Each test socket may hold a corresponding device.

In some implementations, a test socket is device-specific. For example, the test socket may contain electrical contacts that are complementary to corresponding electrical contacts on a device under test (DUT). Among other things, the loading robots may be configured to place untested devices into test sockets, and to remove tested devices from test sockets. The test sockets are inlaid in the test carrier, and contain walls that may guide devices under test into position so that electrical contacts in the carrier test socket and electrical contacts on the device under test align. In some implementations, for example, where the electrical contacts are relatively large, the loading robots may not require a high level of precision, and the test socket walls may play a prominent role in guiding devices under test into position so that electrical contacts in the carrier test socket and electrical contacts on the device under test align.

After an untested device reaches a resting position within the test socket, a socket cap is placed over the test socket, among other things, to apply pressure to the device to cause the electrical contacts in the device under test to mate to the complementary electrical contacts in the test carrier. In some implementations, the socket cap may include memory storing executable instructions that are usable by the device during test. For example, the executable instructions may include operational instructions, test routines, and so forth. Accordingly, the socket cap may also include electrical contacts that mate to complementary electrical contacts on the device and/or the test carrier. In some implementations, the socket cap exerts of force on the device in order to implement the various electrical connections; any appropriate amount of force may be applied to implement connections. In some implementations, as described herein, the socket cap may be, or include, a kinematic mount, that applies the force via a compression spring.

Figure 5:
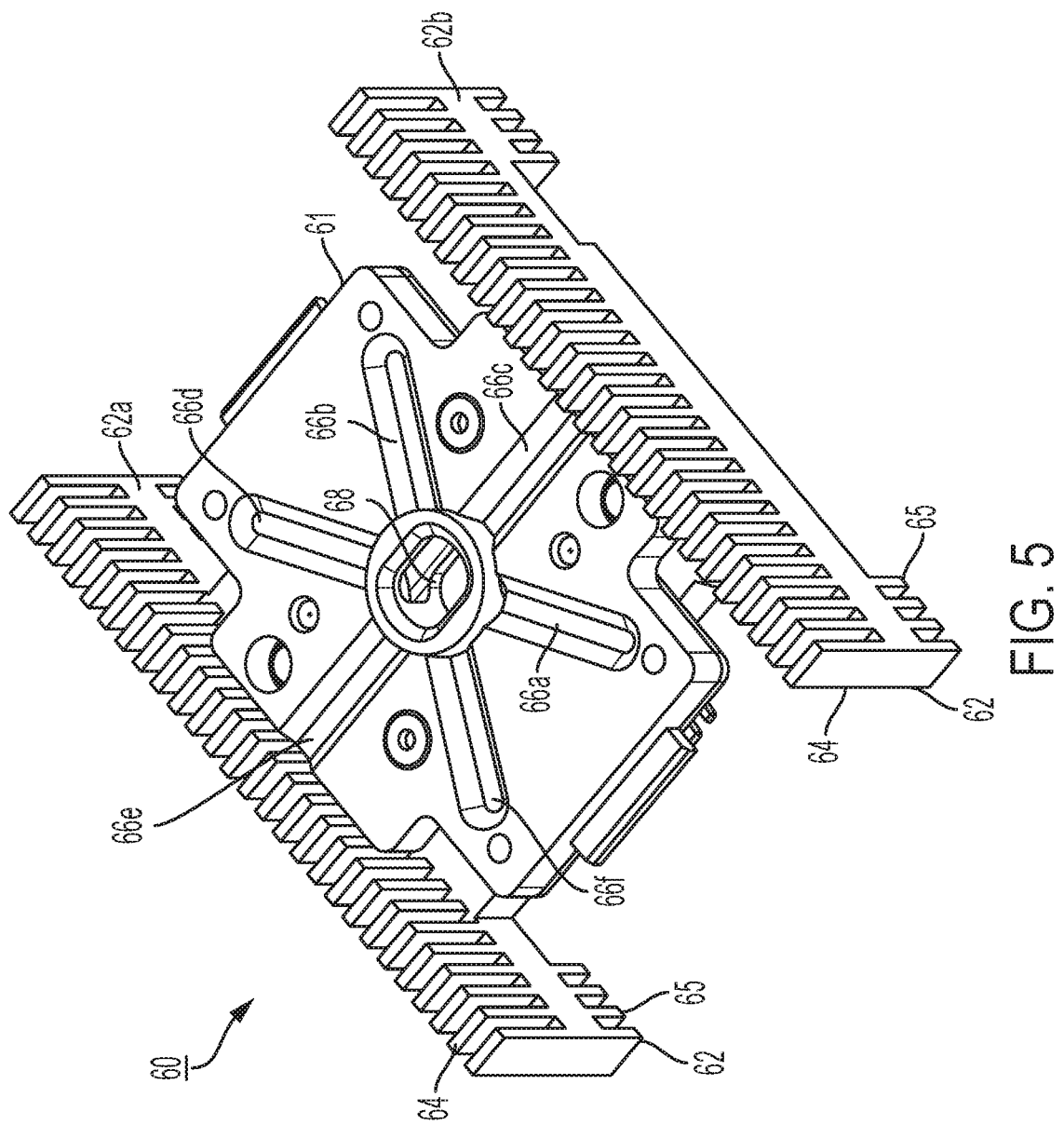
FIG. 5 is perspective view an example lid assembly that fits onto a socket in the example carrier.
Figure 9:
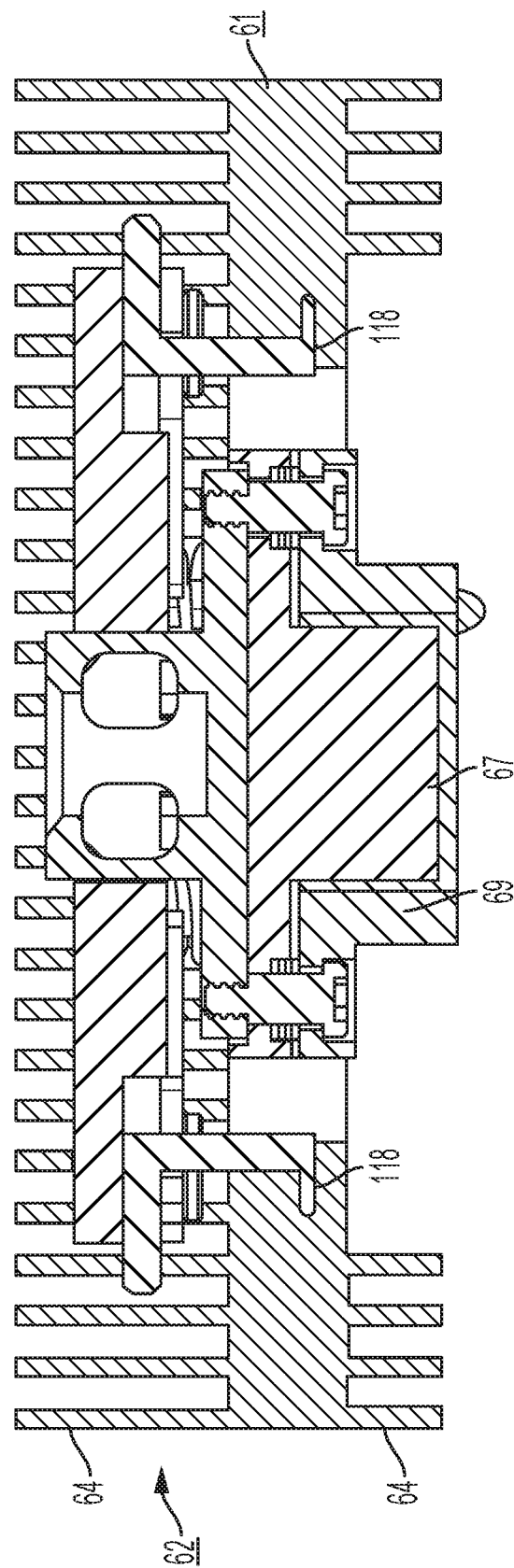
FIG. 9 is cut-away, side view of components of an example lid assembly.

The socket cap may be part of a lid assembly that includes one or more structures—such as, but not limited to, fins—that are configured to provide surface area over which heat from the device dissipates during test. An example of a lid assembly 60 is shown in FIG. 5. A cross-section of the example lid assembly is shown in FIG. 9. In this example, lid assembly 60 includes socket cap 61 and fins 62. In the example of FIG. 9, one or more structures 67 contact the device in the socket and create the thermal connection to the fins. Frame 69 surrounds, or bounds, the device in the socket.

In this regard, the socket cap is configured to contact, physically, a device in a corresponding test socket, as described herein. This connection includes a thermal connection between the lid assembly and the device in the test socket. In some implementations, the thermal connection enables heat to be drawn from a device in the test socket. Heat may be drawn from the device during testing, after testing, or before testing. The socket cap is connected, physically, to structures, such as fins 62. Although fins are shown in FIGS. 5 and 9, any appropriate structures may be used in place of, or in addition to, the fins. In this example, the fins are configured—for example, shaped or arranged—so as to increase the surface area available for heat to dissipate relative to a socket cap of the same type having no fins. In this example, the fins extend vertically relative to a top plate 63 of the socket cap. In this example, the fins are arranged along the longitudinal dimension of the socket cap. In this example, two sets of fins are used—a first set of fins 62a on a first edge of the socket cap and a second set of fins 62b on a second edge of the socket cap. In this example, the individual fins on each side are equally spaced from each other to form a row of fins. In this example, each of the fins is made of, or includes, a thermally-conductive material, such as metal. Examples of materials that may be used for the fins includes, but are not limited to, aluminum, stainless steel, and graphite. In this example, each fin has about the same size, shape, and composition. In this example, the fins on each edge include fins that extend from both sides of the socket cap. For example, the first set of fins 62a include fins 64 that extend upward from socket cap 61 when socket cap 61 is placed on the carrier and fins 65 that extend downward from socket cap 61 when socket cap 61 is placed on the carrier.

In some implementations, the fins are an integrated part of the socket cap. For example, the fins and socket cap may be formed—for example, molded—together and constitute a single contiguous structure. In some implementations, the fins are not an integrated part of the socket cap. In such implementations, the fins may be fixed to the socket cap subsequently to form the lid assembly.

Although a specific configuration of the fins on the lid assembly has been shown in FIGS. 5 and 9 and described above, the fins may have any appropriate sizes, shapes, arrangements, compositions, and configurations. For example, the fins may have increased surface area relative to the surface area shown in FIG. 5. There may be more fins or fewer fins than shown. Individual fins may be made of different materials. The fins may be made of a different material than socket cap 61 or of the same material as socket cap 61. There may be more than two rows of fins. Rows of fins, as appropriate, may extend across the lateral dimension of the socket cap.

As noted, the fins may be made of, or include, a thermally-conductive material. The material may have any appropriate thermal conductivity. For example, the thermal conductivity of each fin or of some of the fins may be, or exceed, predefined values of 5 Watts/meter-Kelvin (W/m-K), 6 W/m-K, 7 W/m-K, 8 W/m-K, 9 W/m-K, 10 W/m-K, 11 W/m-K, 12 W/m-K, 13 W/m-K, 14 W/m-K, 15 W/m-K, or 16 W/m-K.

In some implementations, the socket cap may include a conductive temperature control device in addition to the convective temperature control system enabled by the fins and the air movers. For example, the socket cap may include a heater, such as one more heating elements to add heat to a device covered by the socket cap in the carrier. For example, the socket cap may include a Peltier device to draw heat from, and thereby cool, a device covered by the socket cap in the carrier.

Figure 6:
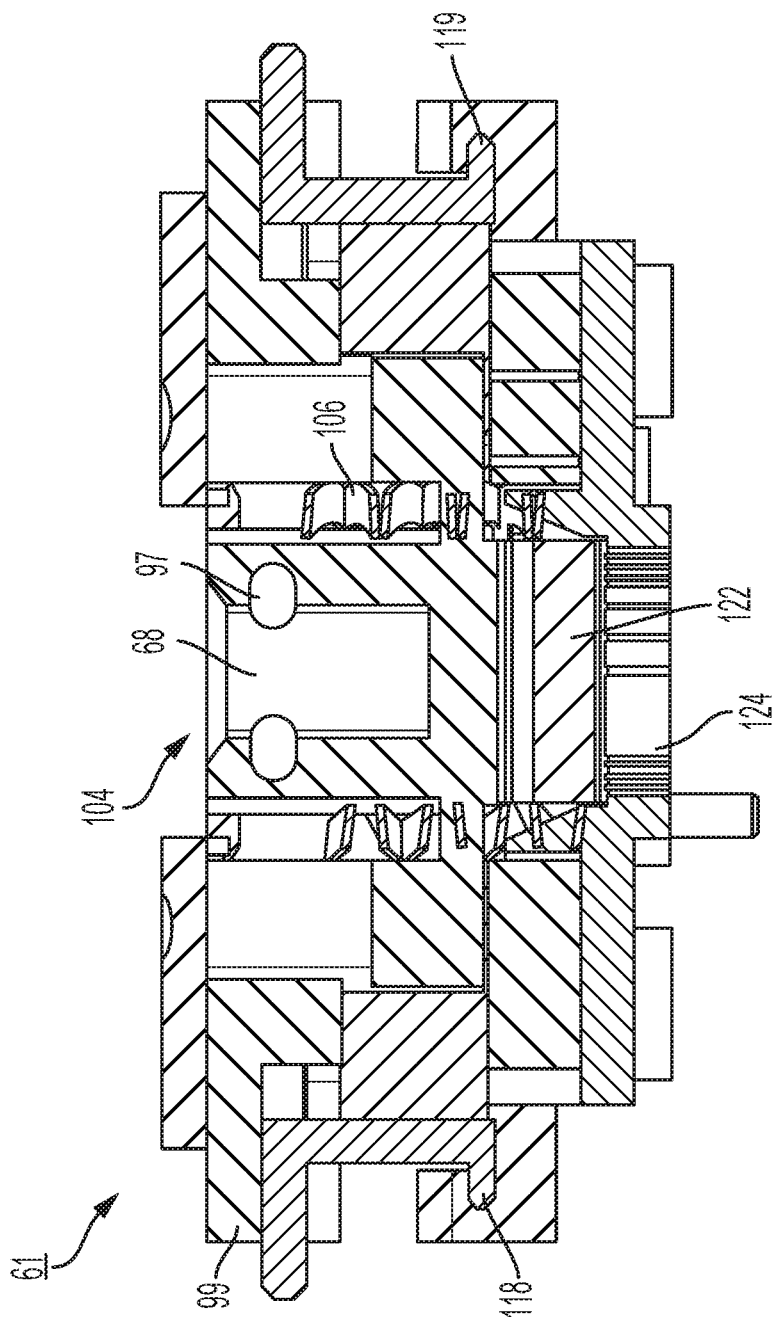
FIG. 6 is cut-away, side view of components of an example socket cap that may be part of the example lid assembly.
Figure 7:
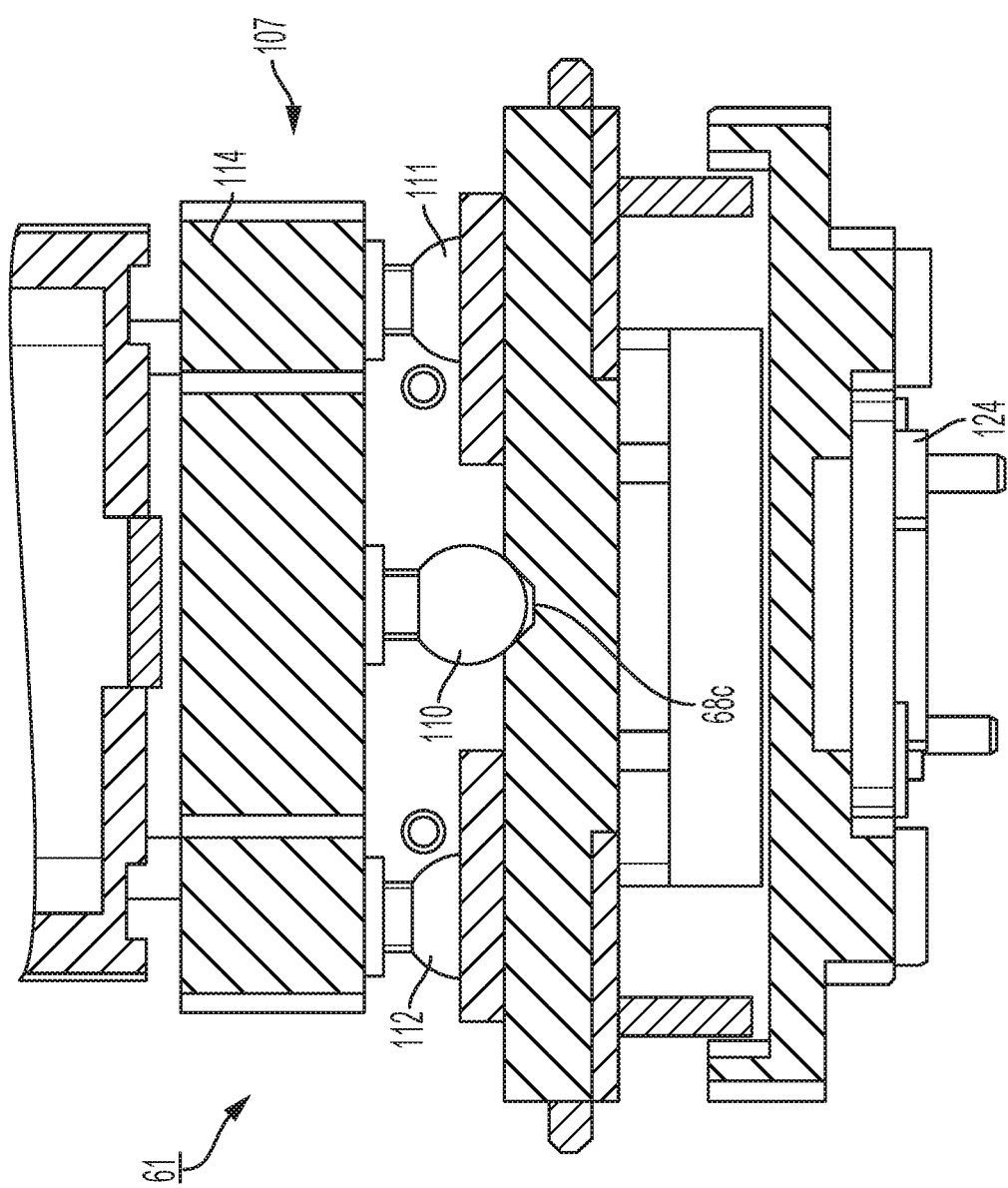
FIG. 7 is a side view of components of an example tool connecting to the example socket cap.
Figure 8:
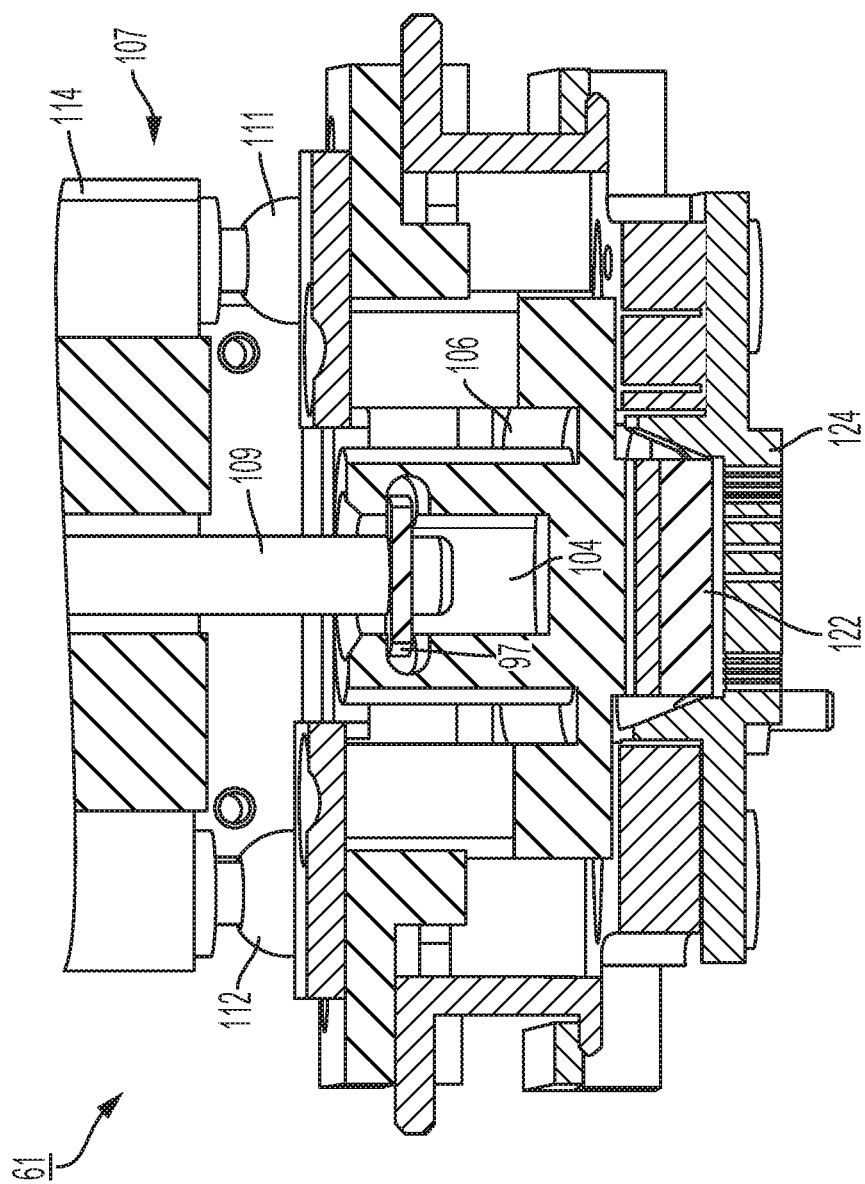
FIG. 8 is a cut-away side view of components of the example tool connecting to the example socket cap.

In some implementations, the entire lid assembly, including the socket cap and the fins, is mounted onto, or removed from, a socket in the carrier. That is, the socket cap and fins are not typically installed separately on the carrier. Rather, in one operation or set of operations, as described below with respect to FIGS. 6 to 8, a single lid assembly is mounted to, or removed from, a socket in the carrier. FIGS. 6 to 8 omit the fins to illustrate components of an example socket cap.

Referring to FIG. 6, in some implementations, the socket cap 61 may be, or include, a kinematic mount, that applies force to a device in a test socket via a compression spring. In some implementations, the kinematic mount is built into the top of the socket cap, and an air-float bearing is employed to float the test carrier during docking of the kinematic mount. In some implementations, the kinematic mount is a purely mechanical mechanism for precisely aligning the test socket and the test socket lid. In some implementations, a vacuum system is used within the same air bearing to suction down (e.g., to chuck) and to secure the test carrier during the loading and unloading of devices from the test carrier following alignment with the kinematic mount. In some implementations, as described, the test carrier contains two test sockets, and a separate socket cap is attachable to each test socket. In some implementations, the socket cap floats during the connection (or latching) process, so that the act of connecting the socket cap to the test socket does not disturb the device location during precision placement of the socket cap. In this regard, tooling balls may be lowered to an arbitrary height, and then the test carrier may be floated upwards to enable the tooling balls to align the socket cap to the socket cap actuator. In some implementations, this floating ensures that vertical tolerances in the test carrier do not result in excessive downward force being applied to the socket cap, and, in turn, into a circuit board within the test carrier, which could result in micro-strain fractures of copper tracking within the circuit board within the test carrier. In some implementations, once the test carrier is aligned to its unique position, this position is retained by applying negative pressure to the floatation mechanism (e.g., by suctioning air to create a vacuum), causing the test carrier to secure to the base of the carrier shuttle.

As explained the socket cap is configured to contact a device in a test socket of the test carrier and, in response to pressure, to cause the device to connect electrically to electrical connections in the test carrier and/or in the socket cap. The actuator may be movable relative to the socket cap to engage the socket cap to enable to socket cap to apply pressure as described herein. The actuator may include a key element and tooling balls. Referring also to FIGS. 5 to 8, socket cap 61 includes a top plate 63 having grooves 66a, 66b, 66c, 66d, 66e, and 66f that are configured and arranged to engage corresponding tooling balls. The top plate includes a hole 68 having a complementary shape to the key element to allow the key element to pass through the hole when the key element is in the proper orientation.

Referring to FIGS. 6 and 8, the example socket cap also includes a center plunger 104 that is engageable by the key element. The center plunger 104 includes a hole to receive the key element that passed through the top plate. Referring to FIG. 8, the key element and the plunger hole have complementary shapes 97 to allow the key element to pass through the plunger hole when the key element is in the proper orientation. The key element is configured to rotate in the plunger hole to rotate to engage notches in the plunger. That is, when rotated within the plunger hole, the key element cannot be slid out of the hole, but rather connects to the plunger and causes the plunger to move in response to upward force. The socket cap also includes a compression spring 106 which is controlled by the actuator.

Actuator 107 may include includes the key element 109 that is rotatable, tooling balls, such as 110, 111, 112 arranged relative to the key element; and a block 114 to which the tooling balls are fixed. The key element is movable through the block, and relative to tooling balls. Referring to FIGS. 7 and 8, actuator 107 is controllable to move the key element inside plunger 104 and to rotate the key element inside plunger 104. Meanwhile, the tooling balls engage the grooves. For example, FIG. 7 shows tooling ball 110 engaging groove 68c. Other tooling balls 111, 112 are engaging other grooves, although those other grooves cannot be seen in FIG. 7. Then, in this example, the actuator is controlled to push the tooling balls downward against the grooves, and to pull the key element upwards along with the plunger 104. This causes compression spring 106 in the socket cap to compress. With the compression spring compressed in this manner, the socket cap may be placed precisely over the device in the test socket without applying significant force. Once the socket cap is placed into position, appropriate force may be applied by releasing the compression spring.

The actuator may be part of a test socket picker head of a loading robot. The test socket picker head places the socket cap over the test socket containing an untested device. The socket cap includes flanges 118, 119 that physically hold the socket cap in place in the test socket. Following physical connection of the socket cap to the test socket via the flanges, the actuator is released, which causes the compression spring to release and to apply force downward. This force is sufficient to make the connections among the test carrier, the device, and/or memory in the socket cap. For example, referring to FIG. 6, the socket cap may include a memory stack 122 containing pins that connect, e.g., through an interposer 124, to complementary pins on an upper surface of the device to be tested. The compressive force of the spring enables connections of these pins to the device and connection of pins on the device to complementary pins on a circuit board that is on the test carrier and that is located beneath the device to be tested.

In some implementations, interposer may be made of, or include, a thermally-conductive material. The material may have any appropriate thermal conductivity. For example, the thermal conductivity of each fin, or of some of the fins may be, or exceed 5 Watts/meter-Kelvin (W/m-K), 6 W/m-K, 7 W/m-K, 8 W/m-K, 9 W/m-K, 10 W/m-K, 11 W/m-K, 12 W/m-K, 13 W/m-K, 14 W/m-K, 15 W/m-K, 16 W/m-K, and so forth. Any appropriate material may be used including, but not limited to metal or graphite. The interposer may contact the device in the test socket directly or the interposer may contact the device through one or more appropriate thermally-conductive structures. The interposer may contact the fins directly or the interposer may contact the fins through one or more appropriate thermally-conductive structures. In any event the resulting thermal connection between the device and the fins produces the heat transfer described herein and enables the device to cool or, in some cases, heat.

Figure 10:
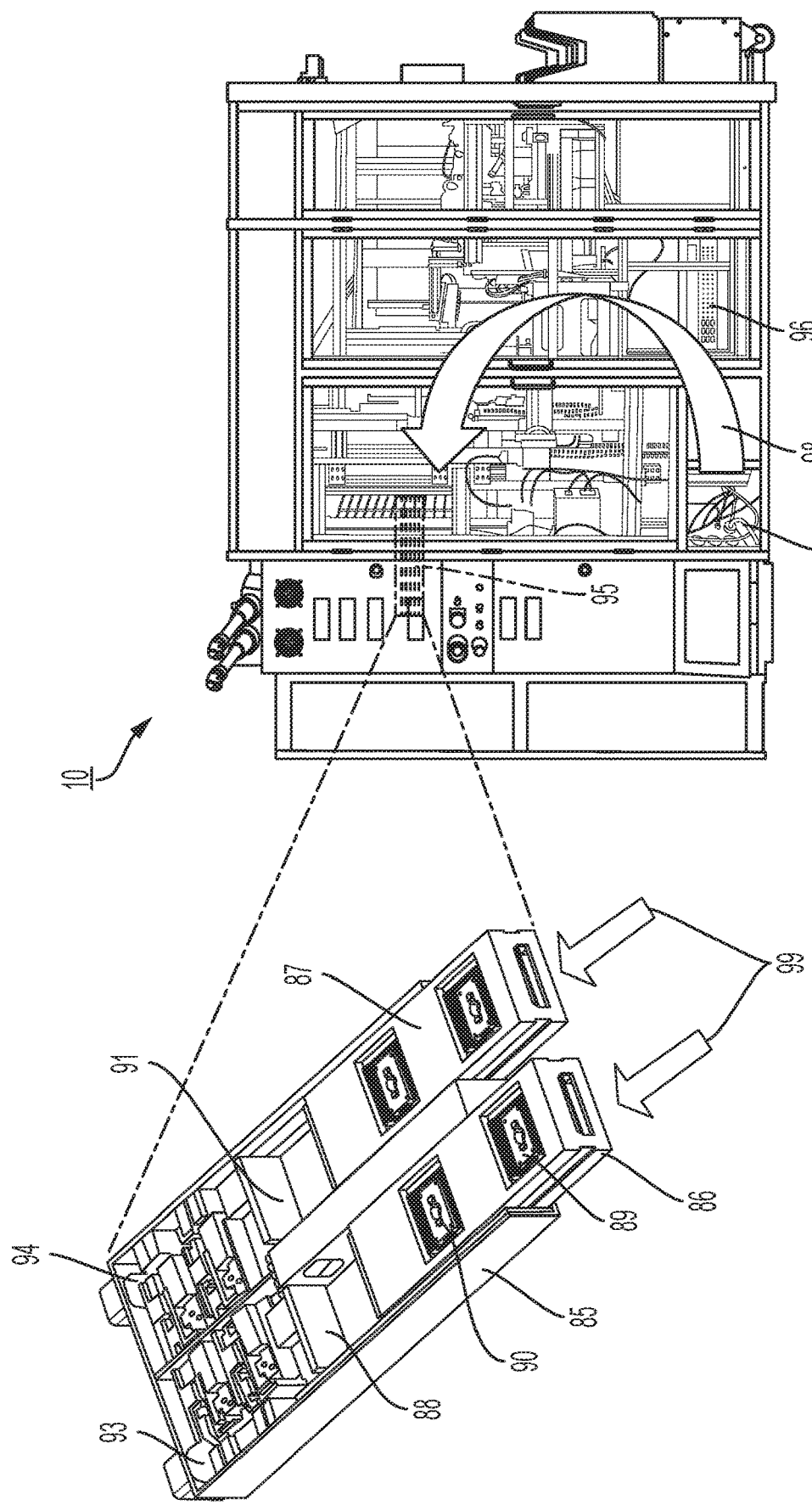
FIG. 10 contains an exploded, perspective view of an example slot in the test system and a side view of the example test system showing internal components of the example test system.

FIG. 10 shows an example a test slot 85 that may be used in the carrier-based test system. In this example, a single test slot 85 houses two carriers 86 and 87. However, this is not a requirement. In some implementations, a single test slot may house a single carrier and in some implementations a single test slot may house more than two carriers. As shown, example carrier 86 is inserted into test slot by a test arm, such as test arm 77 or 78 of FIG. 3. The test slot includes an electrical interface (not shown) that mates to a corresponding electrical interface 88 in test slot 85. As a result, electrical signals may be exchanged—for example, during test—between the test system and devices held in corresponding sockets in carrier 86, as described herein. Carrier 87 makes a similar connection to electrical interface 91.

Test slot 85 includes air movers 93 and 94, such as fans or blowers, to move air over, and through, the fins of the lid assembly, drawing heat from the fins and causing the device to cool. As explained below, heated air may also be moved over, and through the fins, as appropriate. In this example, there are two air movers, one to service each carrier in test slot 85. In some implementations, there may be one air mover per carrier or more than one air mover per carrier. Any appropriate number of air movers may be used to service a test slot.

FIG. 10 also shows a side view of example carrier-based test system 10 of FIG. 1. Test slot 85 fits into carrier-based test system 10 at location 95 in this example. In this example, the carrier-based test system includes a test rack to hold the test slot and multiple other test slots. As described below, the carrier-based test system includes one or more air movers, such as blowers or fans, that are configured circulate air around the test slot in order to cool devices held in the carrier. In this example, the carrier-based test system 10 includes a thermal atrium 96. In some implementations, the thermal atrium is a thermal control chamber containing air maintained at a temperature that, in some cases, is below a predefined temperature. In some implementations, the air in the thermal atrium may be at ambient temperature. For example, the temperature may be between 20° Celsius (C) to 25° C. However, the air temperature is not limited to these values. The air in the thermal atrium may be at any appropriate temperature that is usable to cool devices in the test slot through convection. In some implementations, the air in the thermal atrium may have a temperature that exceeds the temperatures of devices held in the carrier. In this example, heated air may be moved towards the test slot in order to heat devices held in the carrier. That is, the heated air may transfer heat to the fins of the lid assembly, and cause the temperature of the devices in the carrier to rise.

In the example of FIGS. 1 and 10, air may be transferred to the thermal atrium from internal or external to the test system through a front chamber 97 beneath the test rack. For example, one or more air movers, such as blower and fans, and heat exchangers may be used to cool the air and to move the cooled air from the front chamber to the thermal atrium. In some implementations, the thermal atrium may be insulated and air-tight or substantially air-tight to reduce the chances that thermally-controlled air in the thermal atrium will escape into the environment, change considerably in temperature, or both. An example air flow path from the front chamber, through the thermal chamber, and over the test slots is shown conceptually by arrow 98.

FIG. 10 also shows the path air takes through test slot 85 using arrows 99. In this example, air from thermal atrium passes over the rack containing test slot 85. The air flow generated by an air movers on or near the test rack and in the slot create an air circulation. In this example, that circulation causes air from the thermal chamber, such as ambient air, to move over, and through, the fins of a test socket's lid assembly, drawing heat from the fins and causing the device covered by the lid assembly to cool. In cases where heating is desired, the air, via the fins, increases the temperature of the device. In an example, the air exiting the test slot may be cooled (or heated) and drawn back into the thermal chamber via air movers and heat exchangers located in front chamber 97. In some implementations, air exiting the test slot may be 40° C. to 60° C. in temperature. The temperature of the exiting air may depend on the temperature of the air introduced into the slot, the amount of heat drawing from a device in the slot, or both.

In some implementations, the air movers in chamber 97 and in the test slots and the flow of cooling water the heat exchangers can be computer-controlled using a "PID" (proportional, integral, differential) control system loop. The flow of current through electrically-powered heaters located in a carrier can also be computer-controlled using a PID control system loop. Each PID control system loop may be implemented using control software and using electrical control circuit boards in a carrier or in test slot circuit boards and rack monitor circuit boards. A PID control system continuously calculates an error value based on a difference between a target value and a measured value. The PID controller applies a correction to the measured value based on proportional, integral, and derivative terms to bring the measured value closer to the target value. In this example, the measured value is the device temperature. As a result, the system enables separate temperature control over various devices in the system, for example, on a device-by-device basis or a carrier-by-carrier basis.

The example processes described herein may be implemented by, and/or controlled using, one or more computer systems comprising hardware or a combination of hardware and software. For example, a system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The example process described herein can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a wired or wireless connection that includes or does not include intervening components but that nevertheless allows electrical signals to flow between connected components. Any "connection" involving electrical circuitry that allows signals to flow, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A test system comprising:
a carrier comprising a test socket to receive a device to test, the test socket comprising electrical connections; and
a lid assembly comprising:
a socket cap to contact the device to apply pressure to cause the device to connect electrically to the electrical connections, the socket cap comprising a material having a thermal conductivity that exceeds a defined value; and
one or more structures configured to provide surface area over which heat from the device dissipates, the one or more structures comprising a material having a thermal conductivity that exceeds the defined value;
wherein the one or more structures comprise fins that extend both upward from the socket cap and downward from the socket cap, and wherein the lid assembly is configured to fit over the device and inlaid within the carrier.

2. The test system of claim 1, wherein the fins are connected thermally to the device via the socket cap, the fins extending away from the device.

3. The test system of claim 1, wherein the fins are connected thermally to the device via the socket cap, the fins being arranged in one or more rows.

4. The test system of claim 1, wherein the fins and the socket cap are integrated into a single structure comprising the lid assembly.

5. The test system of claim 1, wherein the fins are connected thermally to the device via the socket cap, the fins comprising metal.

6. The test system of claim 1, wherein the fins are connected thermally to the device via the socket cap, the fins being metal.

7. The test system of claim 1, further comprising:
a test slot to receive the carrier, the test slot comprising an interface to which the carrier connects electrically, the test slot comprising an air mover that is configured to move air over the lid assembly.

8. The test system of claim 7, further comprising:
a thermal control chamber comprising air maintained at a temperature; and
a test rack to hold the test slot among multiple test slots, the test rack comprising one or more air movers configured move air into the thermal control chamber.

9. The test system of claim 8, wherein the temperature is ambient temperature.

10. The test system of claim 1, wherein the test socket is a first test socket, the device is a first device, and the carrier comprises a second test socket to hold a second device to test.

11. The test system of claim 1, further comprising:
a test slot to receive the carrier, the test slot comprising an interface to which the carrier connects electrically; and
robotics to move the carrier into, and out of, the test slot.

12. The test system of claim 1, further comprising:
an actuator that is configured to engage the socket cap for placement over the device or for removal from over the device.

13. A test system comprising:
a carrier comprising a test socket to receive a device to test, the test socket comprising electrical connections; and
a lid assembly comprising:
a socket cap to contact the device to apply pressure to cause the device to connect electrically to the electrical connections, the socket cap comprising a material having a thermal conductivity that exceeds a defined value; and
one or more structures configured to provide surface area over which heat from the device dissipates, the one or more structures comprising a material having a thermal conductivity that exceeds the defined value; and an actuator that is configured to engage the socket cap for placement over the device or for removal from over the device;

wherein the actuator comprises:
a key element that is rotatable;
tooling balls arranged relative to the key element; and
a block, the tooling balls being fixed to the block, and the key element passing through the block and being movable relative to the block.

14. The test system of claim 13, wherein the socket cap comprises a kinematic mount, the kinematic mount comprising:
a first structure comprising grooves that are configured and arranged to engage the tooling balls, the first structure having a hole, the hole and the key element having complementary shapes to allow the key element to pass through the hole;
a second structure having a hole, the hole and the key element having complementary shapes to allow the key element to pass through the hole, the key element being configured to rotate to engage the second structure; and
at least one compression spring controllable by the first structure and the second structure.

15. The test system of claim 14, wherein the actuator is configured to cause operations comprising:
the actuator engages the socket cap forcing the tooling balls against the grooves and causing the key element to pass through the first and second structures;
the actuator rotates the key element;
the key element pulls against the second structure while the tooling balls pushes against the grooves to compress the compression spring;
the actuator moves the socket cap in place over the device causing the socket cap to connect to the test carrier; and
following connection of the socket cap to the test carrier, the actuator retracts.

16. A test system comprising:
an atrium containing air maintained at a temperature;
a test slot configured to receive the air from the atrium, the test slot comprising at least one air mover for moving the air from the atrium through the test slot;
a carrier having test sockets for insertion into the test slot, each test socket to receive a device to test, the carrier comprising a lid assembly, the lid assembly comprising a socket cap and fins that are thermally connected to the device, the fins for providing surface area over which to dissipate heat from the device, the fins comprising a material having a thermal conductivity that exceeds a defined value;
wherein the at least one air mover is configured to move the air through the fins; and
wherein the fins extend both upward from the socket cap and downward from the socket cap, and wherein lid assembly is configured to fit over the device and inlaid within the carrier.

17. The test system of claim 16, wherein the fins extend away from the device.

18. The test system of claim 16, wherein the fins are arranged in one or more rows.

19. The test system of claim 16, wherein the fins comprise metal.

20. The test system of claim 16, wherein the fins are metal.

21. The test system of claim 16, wherein the socket cap is configured to fit over the device in the test socket; and
wherein the fins and the socket cap are a single part comprising the lid assembly.

22. The test system of claim 16, wherein the test system comprises multiple test slots, each of the multiple test slots being configured to receive a separate carrier, each carrier being configured to hold one or more devices; and
wherein the test system further comprises a control system comprising a proportional, integral, derivative (PID) controller, the PID controller to control, separately, temperatures of devices in different carriers.

* * * * *